United States Patent [19]

Cooperman et al.

[11] Patent Number: 4,656,621

[45] Date of Patent: Apr. 7, 1987

[54] DIGITAL SWITCHING SYSTEM

[75] Inventors: Michael Cooperman, Framingham; Donald J. Gray, Lynnfield; Richard W. Sieber, Attleboro; Rob Moolenbeek, Ashland, all of Mass.

[73] Assignee: GTE Laboratories Incorporated, Waltham, Mass.

[21] Appl. No.: 882,023

[22] Filed: Jul. 3, 1986

Related U.S. Application Data

[63] Continuation of Ser. No. 687,548, Dec. 28, 1984, abandoned.

[51] Int. Cl.$^4$ .......................... H04Q 11/04; H04J 3/04
[52] U.S. Cl. ........................................ 370/59; 370/58; 370/66; 370/61; 370/112
[58] Field of Search ................. 370/58, 66, 61, 59, 370/109, 112, 110.1; 340/825.79, 825.83

[56] References Cited

U.S. PATENT DOCUMENTS

| | | | |
|---|---|---|---|
| 3,084,222 | 4/1963 | Foot et al. | 370/109 |
| 3,105,874 | 10/1963 | Fisher, Jr. | 178/50 |
| 3,105,875 | 10/1963 | David | 178/50 |
| 4,027,301 | 5/1977 | Mayer | 340/183 |
| 4,071,711 | 1/1978 | Beaupre et al. | 179/41 A |
| 4,430,734 | 2/1984 | Hubbard | 370/112 |
| 4,432,087 | 2/1984 | Hubbard | 370/55 |

Primary Examiner—Douglas W. Olms
Assistant Examiner—Wellington Chin
Attorney, Agent, or Firm—Hamilton, Brook, Smith & Reynolds

[57] ABSTRACT

A digital switching system for switching messages between a plurality of subscribers located a relatively short distance from the switching system. The message format for the system comprises the serial transmission of messages of M bits of information which are transmitted from the switching system to the subscribers during one-half of a transmission frame and messages of M bits of information which are transmitted from the subscribers to the switching system during the other half of the transmission format. Addressable memory arrays are employed at the switching system for multiplexing and serial-to-parallel conversion and switching. In a preferred embodiment up to 40 telephone and/or data terminal messages are handled in .125 microsecond time frames with 8 bit voice and 8 bit data words plus a start and stop bit and 1 signalling bit message format from each of the subscribers.

40 Claims, 28 Drawing Figures

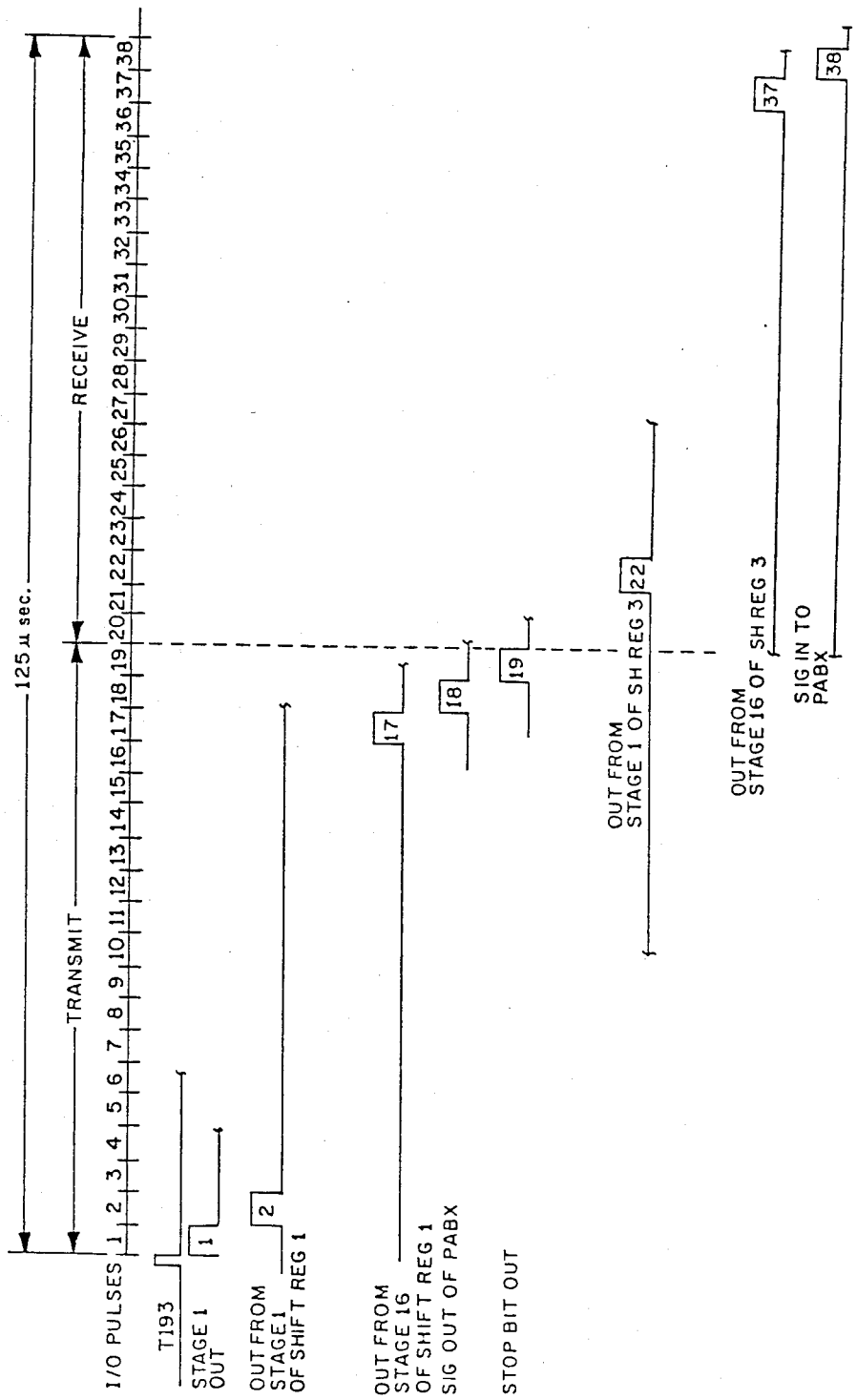

Fig. 8
SAR CONTENTS IN EXAMPLE
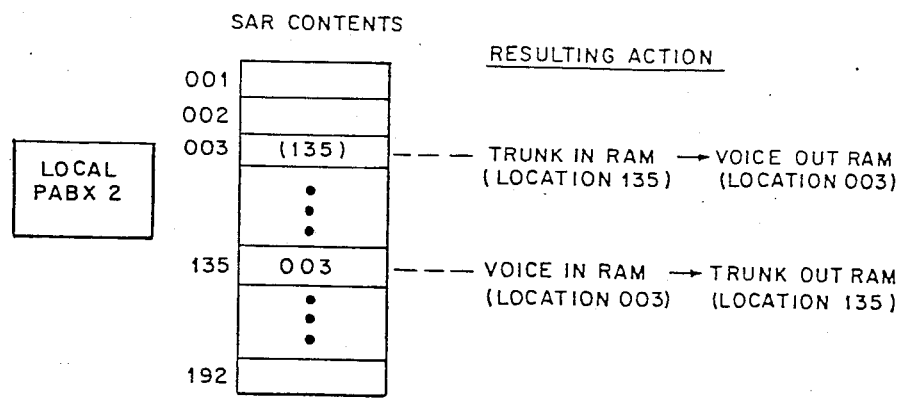
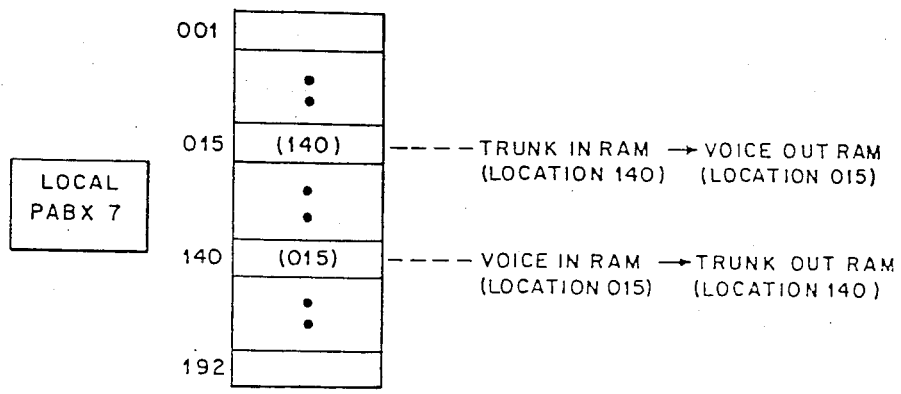

| TIME INTERVAL T | SHIFT REGISTER CONTENTS | | | MEMORY CONTENTS | | | |
|---|---|---|---|---|---|---|---|
| 1 | | | | $A_1$ | $B_1$ | $C_1$ | $D_1$ |
| | | | | X | X | X | X |
| | | | | X | X | X | X |
| 2 | | | | $A_1$ | $B_1$ | $C_1$ | $D_1$ |
| | | | | $A_2$ | $B_2$ | $C_2$ | $D_2$ |
| | | | | X | X | X | X |
| 3 | | | | $A_1$ | $B_1$ | $C_1$ | $D_1$ |
| | | | | $A_2$ | $B_2$ | $C_2$ | $D_2$ |
| | | | | $A_3$ | $B_3$ | $C_3$ | $D_3$ |
| 4 | $A_1$ | $A_2$ | $A_3$ | | | | |
| 5 | $A_2$ | $A_3$ | X | | | | |
| 6 | $A_3$ | X | X | | | | |
| 7 | $B_1$ | $B_2$ | $B_3$ | | | | |
| 8 | $B_2$ | $B_3$ | X | | | | |
| 9 | $B_3$ | X | X | | | | |
| 10 | $C_1$ | $C_2$ | $C_3$ | | | | |
| 11 | $C_2$ | $C_3$ | X | | | | |
| 12 | $C_3$ | X | X | | | | |
| 13 | $D_1$ | $D_2$ | $D_3$ | | | | |
| 14 | $D_2$ | $D_3$ | X | | | | |
| 15 | $D_3$ | X | X | | | | |
| 16 | | | | $A_4$ | $B_4$ | $C_4$ | $D_4$ |
| | | | | $A_2$ | $B_2$ | $C_2$ | $D_2$ |

3-BIT PARALLEL TRANSFERS

X = INDETERMINATE STATE

Fig. 15

| TIME INTERVAL T | SHIFT REGISTER CONTENTS | | | MEMORY CONTENTS | | | |
|---|---|---|---|---|---|---|---|
| 1 | A | X | X | | | | |
| 2 | $A_2$ | $A_1$ | X | | 3-BIT PARALLEL TRANSFERS | | |
| 3 | $A_3$ | $A_2$ | $A_1$ | | | | |
| 4 | | | | $A_1$ | X | X | X |
|  |  |  |  | $A_2$ | X | X | X |
|  |  |  |  | $A_3$ | X | X | X |
| 5 | $B_1$ | X | X | | | | |
| 6 | $B_2$ | $B_1$ | X | | | | |
| 7 | $B_3$ | $B_2$ | $B_1$ | | | | |
| 8 | | | | $A_1$ | $B_1$ | X | X |
|  |  |  |  | $A_2$ | $B_2$ | X | X |
|  |  |  |  | $A_3$ | $B_3$ | X | X |
| 9 | $C_1$ | X | X | | | | |
| 10 | $C_2$ | $C_1$ | X | | | | |
| 11 | $C_3$ | $C_2$ | $C_1$ | | | | |
| 12 | | | | $A_1$ | $B_1$ | $C_1$ | X |
|  |  |  |  | $A_2$ | $B_2$ | $C_2$ | X |
|  |  |  |  | $A_3$ | $B_3$ | $C_3$ | X |
| 13 | $D_1$ | X | X | | | | |
| 14 | $D_2$ | $D_1$ | X | | | | |
| 15 | $D_3$ | $D_2$ | $D_1$ | | | | |
| 16 | | | | $A_1$ | $B_1$ | $C_1$ | $D_1$ |
|  |  |  |  | $A_2$ | $B_2$ | $C_2$ | $D_2$ |
|  |  |  |  | $A_3$ | $B_3$ | $C_3$ | $D_3$ |

X = INDETERMINATE STATE

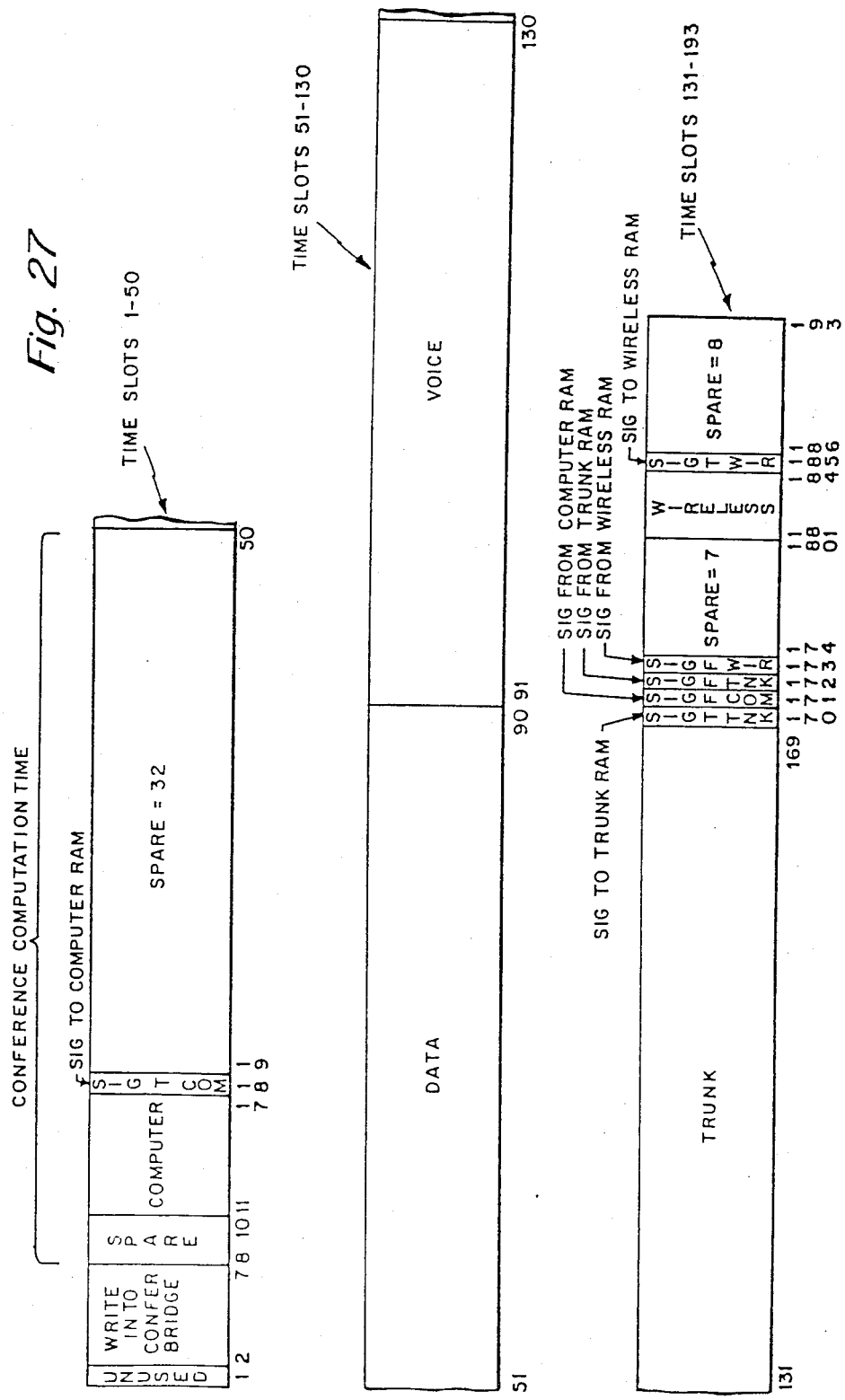

DIGITAL SWITCHING SYSTEM

This is a continuation of co-pending application Ser. No. 687,548, filed on Dec. 28, 1984, now abandoned.

DESCRIPTION

1. Technical Field

The present invention relates to digital switching systems and, more particularly, to a private automatic branch exchange for switching and transmitting digital signals between a plurality of telephone/data terminals and a central switching system.

2. Background Art

Present day electronic Private Automatic Branch Exchanges (PABX) are relatively bulky, costly and consume considerable power. These shortcomings can be lessened by fabricating a PABX using state-of-the-art Very Large Scale Integrated Circuit (VLSI) technology. VLSI technology can provide over ½ million transistors in a single chip. However, in order to realize the full potential of VLSI technology in the fabrication of a PABX, a number of problems must be avoided in the process.

While VLSI chips can perform highly complex functions, the level of complexity required for incorporation of a PABX on a single chip can be increased significantly by using circuit structures with regular features, such as RAMS (Random Access Memories), ROMS (Read Only Memories) and PLA's (Program Logic Arrays).

Conventional PABX utilize time division multiplexed (TDM) digital bit streams of pulsed code modulated (PCM) words in which voice or data information is digitally encoded for communication. In some such systems, RAM's are used to store the information as to which bit or bits is to be multiplexed or demultiplexed on or off the bit stream. (See for example, U.S. Pat. No. 4,432,087 to Hubbard issued Feb. 14, 1984.) Multiplexing is accomplished by shifting data from the bit stream into shift registers at a low rate and sequentially shifting data out of the registers at a high rate. Where a large amount of information must be multiplexed/demultiplexed, as in PABX applications, the conventional approach results in use of many shift registers with attendant interconnection complexity and relatively large power dissipation.

A large amount of power is also dissipated in transmitting digital signals between points over transmission lines in a conventional manner. In the conventional approach, line driver transistor circuits are utilized at the transmitting end to produce sufficiently strong signals at the receiving end so that upon reception, a detectable signal remains after attenuation over the transmission line. Usually, such line driver circuits are terminated at the receiving end of the transmission line to prevent reflections which superimpose and interfere with subsequent data transmissions. By terminating at the receiving end, the transmitted signal is substantially absorbed and substantially no reflections occur. In such receiving end terminated structures, it is necessary to have a very low output impedance, i.e., approaching zero, for the output line drivers to minimize power dissipation in the line drivers and to minimize signal attenuation by the output impedance of the line drivers.

In order to achieve such low output impedance, the line driver transistor geometries must be relatively large, consuming a relatively large amount of space. Furthermore, the line driver is required to deliver substantial power which is dissipated in the load termination impedance. As an example, assuming a digital transmission of 5 volt amplitude pulses, over an ideal transmission line the power delivered to the load impedance is 250 MW.

This power dissipation and transistor size is doubled if it is desired to reduce the number of transmission lines by time division duplexing.

These power dissipation considerations are extremely critical in the use and applications of VLSI technology to fabricate a PABX since VLSI imposes severe limitations on the amount of power that can be consumed in a chip.

DISCLOSURE OF THE INVENTION

The foregoing problems have been solved in the present system by an interrelated combination involving several steps and improved devices. One step is the use of a plurality of local PABX's to handle a large but limited number of subscribers within a limited geographical area. The local PABX's are capable of being fabricated in VLSI technology on a single chip, to provide voice and data exchange capability to a plurality of subscribers. The subscribers transmit digitally encoded speech signals and/or digitally encoded data in the conventional manner to the local PABX. The local PABX time division multiplexes (TDM's) each subscriber's signal and transmits the plurality of subscriber's signals to a central exchange for transmittal and reception to and from a plurality of other local single chip PABX's.

In the preferred embodiment, a single local PABX is capable of handling up to forty such subscribers. The connection between the telephone/data terminals and the local PABX employs a twisted pair wire operating in a time division duplex mode. Because the local PABX serves a relatively small number of subscribers in a relatively small geographical area, it can be located within a few hundred feet of each telephone data terminal pair. This results in a considerable reduction of the telephone line length between the subscriber and the PABX, which results in numerous advantages, such as reduced installation cost, reduced line attenuation and cross-talk. Synchronization between the transmitted and received signals is simplified, since the transmission delay is small, compared to the period of the transmitted bit. This eliminates the need for asynchronous receivers with the associated power dissipation and chip area consumption of such receivers.

The short distance, and hence short time delay, between transmission and receipt of signals to and from the local PABX chip and the subscriber's telephone makes it possible, in accordance with the invention, to employ a novel highly efficient apparatus and process for serial-to-parallel conversion. This conversion apparatus accomplishes time division, multiplexing and demultiplexing using a single memory array for all subscribers in which reading is performed orthogonally to writing, hereinafter referred to as "orthogonal memory" or "orthogonal RAMS". Each orthogonal memory, in addition to multiplexing or demultiplexing, provides storage and serial-to-parallel or parallel-to-serial conversion in a regular and compact structure highly suitable for VLSI fabrication techniques.

Use of orthogonal memory in this manner eliminates the necessity of having four bit shift stages for each bit sent from a subscriber. In the preferred embodiment 40, such subscribers are handled per PABX chip. Thirty-two hundred shift bit register stages may thus be eliminated by utilizing the orthogonal memory array of the invention. Eliminating such a large shift register requirement is a major step in making it possible to fabricate a PABX on a single chip.

An additional step in the process of achieving a single chip PABX involves a reduction of the line driver power requirements. As stated earlier, conventional digital line drivers used in digital communication over transmission lines, employ impedance terminations at the receiving end in order to prevent reflections which superimpose as noise with the subsequent transmissions. Such a design requirement necessitates large driver transistor geometries and a capability in the driver to deliver several hundred milliwatts of power.

The method and apparatus of the present invention reduces the power dissipation and the size of the line drive transistors, provided the line delay is short compared to the transmitting pulse width. This size and power dissipation reduction is achieved by terminating the line at the sending end rather than at the receiving end.

Further, in an alternate embodiment of the invention, communication between the local PABX and the telephone data line is accomplished by transmitting and receiving signals over one pair of wires at the same time, thus eliminating the requirement of two pair of wires or the cost of time sharing one pair of wires and reducing the one-way transmission capacity. In this two-wire bidirectional transmission apparatus embodiment, the line driver at one end of the line, say the PABX line driver, has an internal impedance matched to the characteristic impedance of the transmission line which is typically 100 ohms. Similarly, the internal impedance of the line driver at the other end, the telephone data terminal end, is a 100 ohm impedance matched to the 100 ohms characteristic impedance of the twisted pair transmission line. Thus, as the transmitted voltage signal is sent simultaneously by each opposite line driver, in opposite directions down the line, the following occurs:

(1) The output from the PABX driver is attenuated by a factor of two, since the internal impedance of the driver and the characteristic impedance of the transmission line form a two-to-one attenuator. Thus the output signal from the PABX driver is VA/2 wherein VA=-PABX line driver voltage output. Similarly, the output signal from the telephone line driver is VB/2. VB/2 arrives at the PABX side as VBD/2 (wherein "VBD/2" is the delayed and attenuated version of the telephone transmitted signal VB/2.) The same effect occurs on the PABX side of the transmission line, wherein the received signal is VBD/2.

Since VBD/2 is the desired signal at the PABX side, this signal may be separated from the combined received and transmitted signal (VBD/2+VA/2) by subtracting out VA/2. Similarly, at the telephone receiving side, VB/2 may be subtracted out of the received signal leaving VAD/2, which is the desired delayed version of VA.

BRIEF DESCRIPTION OF THE DRAWINGS

The invention will be more fully appreciated from the following detailed description when considered in connection with the accompanying drawings in which:

FIGS. 3A and 3B are timing diagrams of the digital switching system of the invention.

FIG. 8 is a table illustrating the contents of the source address RAM in an example given in the specification.

FIG. 15 illustrates the contents of the memory and shift register of FIG. 14 during demultiplexing.

FIG. 27 is an illustration of the time slot allocations of the digital switching system of the invention.

BEST MODE OF CARRYING OUT THE INVENTION

General Description

To facilitate a comprehension and appreciation for the present invention, the various aspects of the invention will now be described in the context of a local PABX telephone/data time division multiplex digital communication system. However, it is to be understood that individual subsystems of the invention may find separate utility in other applications. These subsystems include, without limitation, the two-wire bidirection switching system, the line driver system, and the orthogonal RAMS used for time division multiplexing. Furthermore, while it is intended that a large percentage of the elements of the PABX be fabricated on a single VLSI chip, portions of such subsystems may be separately fabricated and connected to the chip by well-known means. For example, it may be desirable to have a separate microprocessor chip rather than integrating the microprocessor onto the PABX chip. In such case, a data bus interconnection to the external microprocessor may be utilized with an appropriate internal input/output interface.

I. GENERAL SYSTEM DESCRIPTION

Figure 1:
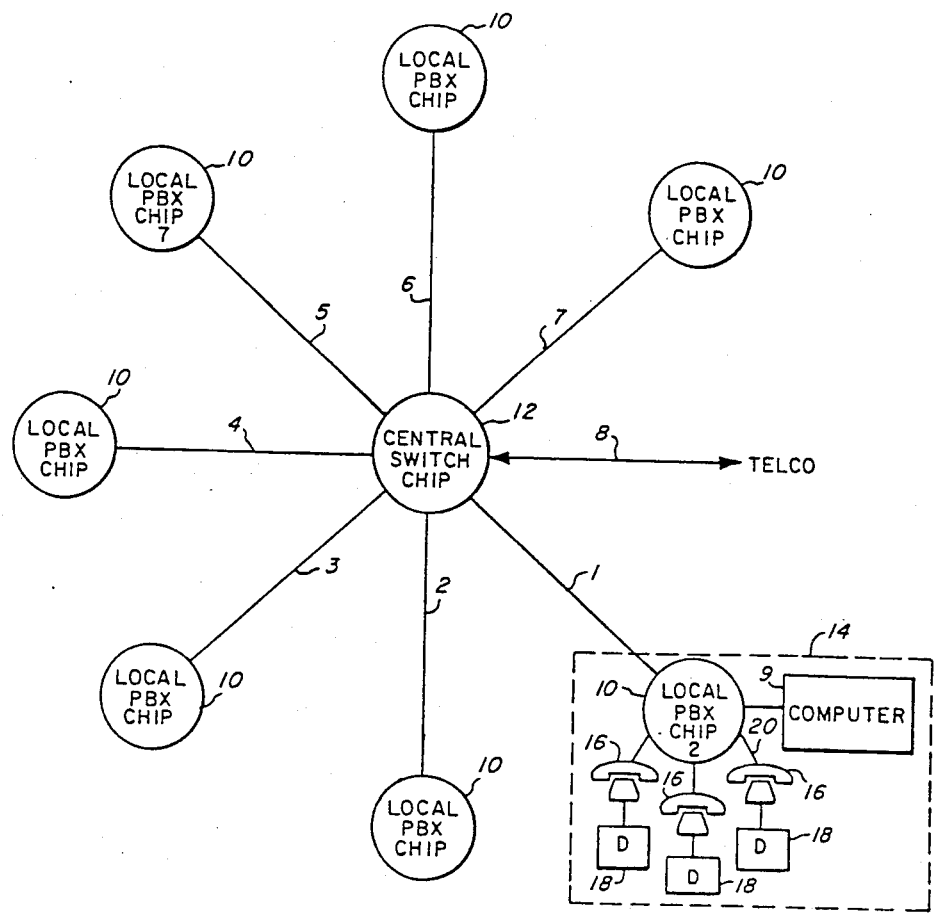
FIG. 1 is an overall block diagram of the digital switching system of the invention.

Referring now to FIG. 1 of the drawings, there is shown a central switch chip 12 which may comprise a number of chips or a single chip which accepts a serial interface and performs such functions as storage and switching of signal information through the trunk line to different local PABX chips. Such devices are commercially available and can be cascaded to handle additional trunk lines 1–7. Chip 12 is interconnected with a plurality of local PABX chips 10, each of which forms a local PABX 14 for up to forty telephone/data terminals 16 and 18, of which three are shown in FIG. 1. The communication links or trunk lines, 1–7, between the central switch chip and the local PBX chips and between the central switch chip 12 and the telephone company equipment, shown by the double-ended arrow trunk line 8, may be conventional two-wire transmission lines or, preferably, fiberoptic communication links, which would provide a substantially noise-free communication link with wide bandwidth.

Each local PABX chip 10 is a self-contained freestanding unit capable of providing multiplexing, storage and signal processing for up to forty telephone/data terminals. The voice signal from the microphone of the telephone 16 is converted by conventional means to a standard companded pulse code modulated (PCM) bit stream of 64 kilobytes per second and is combined with data from data terminals 18 for transmission over a single twisted pair of wires 20 to the local PBX chip 10. Voice or data communication over transmission line 1 to the central switch chip 12 is TDM digital. All activated voice data lines 20 provide communication with the local PBX chips 10, once every frame. As shown in the curve labelled 1/0 pulses of FIG. 3A, each frame is 125 microseconds in duration corresponding to the standard 8 kilohertz sampling frequency.

The message format for each one-way communication between the local PABX and each telephone/data terminal consists of a start bit, 8 voice bits, 8 data bits, 1 signalling bit and 1 stop bit for a total of 19 bits, as shown by the 19 1/0 pulses each, in the time frames labelled TRANSMIT & RECEIVE FIG. 3A. Information flows from the PABX chip 10 to the telephone/data terminals 16 and 18 during the first half (TRANSMIT half) of each frame and in the reverse directions during the second half of each frame (RECEIVE half).

Figure 2:
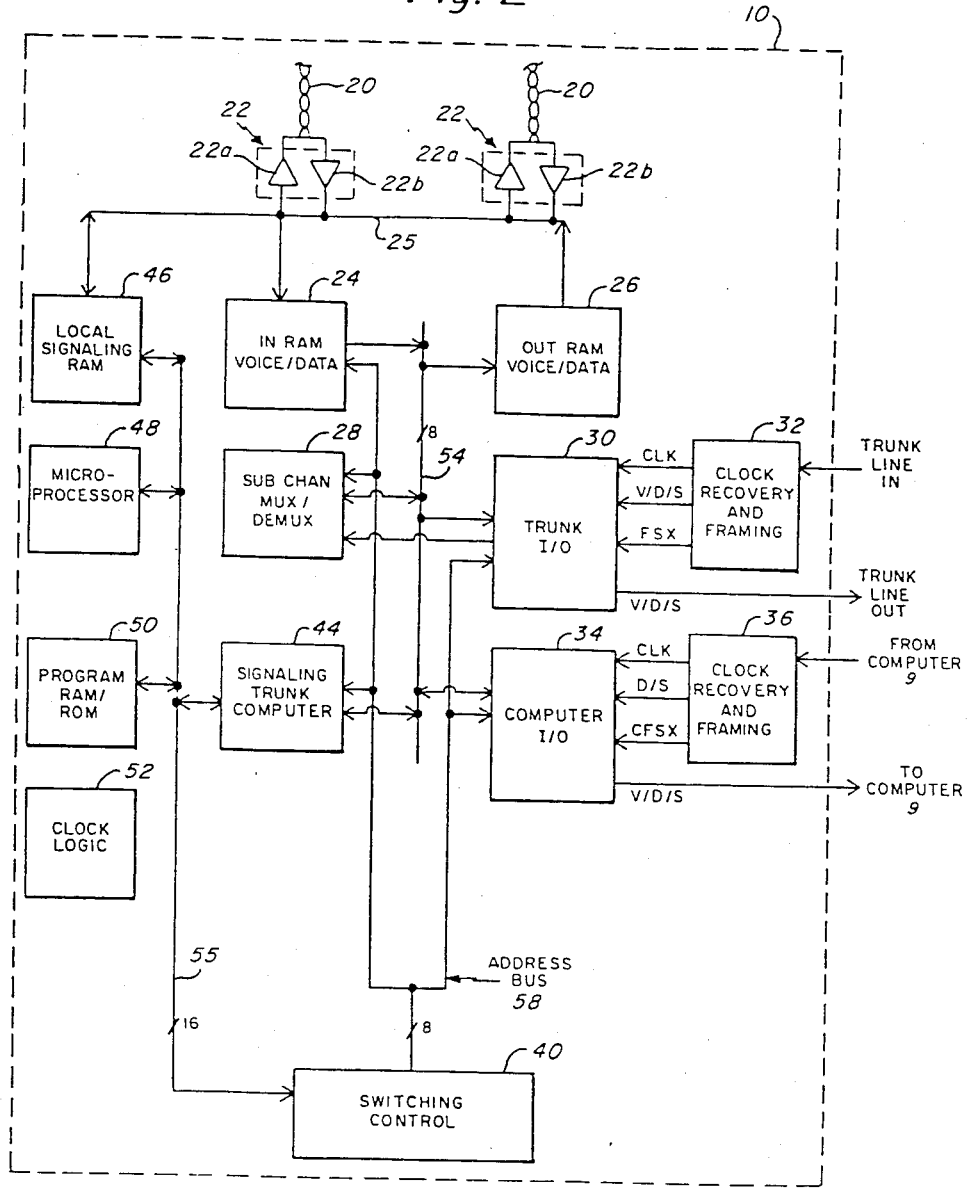
FIG. 2 is a more detailed block diagram of the local PABX chip 10 of the invention.

Referring now to FIG. 2, which is a block diagram of the local PABX chip 10 of FIG. 1, the twisted pair transmission lines 20 are coupled to differential line driver transceivers 22. These transceivers will be explained in detail in connection with FIGS. 17–22. Only two such twisted pairs and transceivers are shown in FIG. 2, for simplicity. However, it should be understood that up to forty such transmission lines and transceivers may be connected to the local PABX. Each transceiver 22 includes a line driver 22a for transmission to the telephone/data terminal and a receiver 22b for reception of transmission from the telephone/data terminal.

The output RAM voice/data subsystem 26 is connected through each line driver 22a to the subscriber's telephone/data terminal during the TRANSMIT or first half of each frame to couple the nineteen bits of information per frame to each of the twisted pair lines 20 for transmission to the telephone/data terminals. In the second half of the frame, nineteen incoming TDM bits of information on each of the twisted pair lines 20 are coupled to bus 25.

The 16 voice/data bits of information on bus 25 from each of the telephone lines 20 is written into the IN-RAM-Voice/Data storage device 24, and the signalling bit is written into the local signalling RAM 46. Based on the signalling information, the microprocessor 48 programs the switching control unit 40 via bus 55, to control the connection of voice and data channels. Bus 55 contains 8 bits of addresses and 8 bits of data. For connections within the area serviced by the PABX chip 10, the information from the IN-RAM-Voice/Data system 24 is transferred to the OUT-RAM-Voice/Data system 26 via the 8-bit switching bus 54. For other connections, the information from the IN-RAM-Voice/Data system 24 is transferred to the trunk I/O unit 30 or computer I/O unit 34, via the same 8-bit switching bus 54. The trunk I/O has two data channels, each capable of handling sixteen 8-kb/s data subchannels, twenty-one 64-kb/s voice/data channels, and one 64 kb/s signalling channel. The 16 data subchannels undergo multiplexing/demultiplexing in subchannel multiplexing/demultiplexing unit 28 so that they can be transmitted/received via the two 64-kb/s trunk channels. Signalling from the trunk and computer I/O units is handled by the microprocessor 48 on an interrupt basis. Local signalling is transmitted and received every 50 milliseconds.

II. SWITCHING WITHIN LOCAL PABX AREA

As stated above, all activated voice/data lines communicate with the PABX chip 10 once every frame, which is 125 microseconds long. Information flows from the PABX 10 to the telephones 16 during the first half of each frame (TRANSMIT) and in the reverse direction during the second half (RECEIVE). It is convenient to first consider the cycle within the local PABX starting the second half-frame, when the local PABX enters the RECEIVE mode. For the moment, it will be assumed that a connection has been established and that all 40 lines are in communication with each other. The manner in which incoming information is switched to its destination involves three steps which will now be explained in connection with FIG. 5, which is a more detailed block diagram of some of the circuitry shown in FIG. 2 and wherein like numerals are retained.

Figure 5:
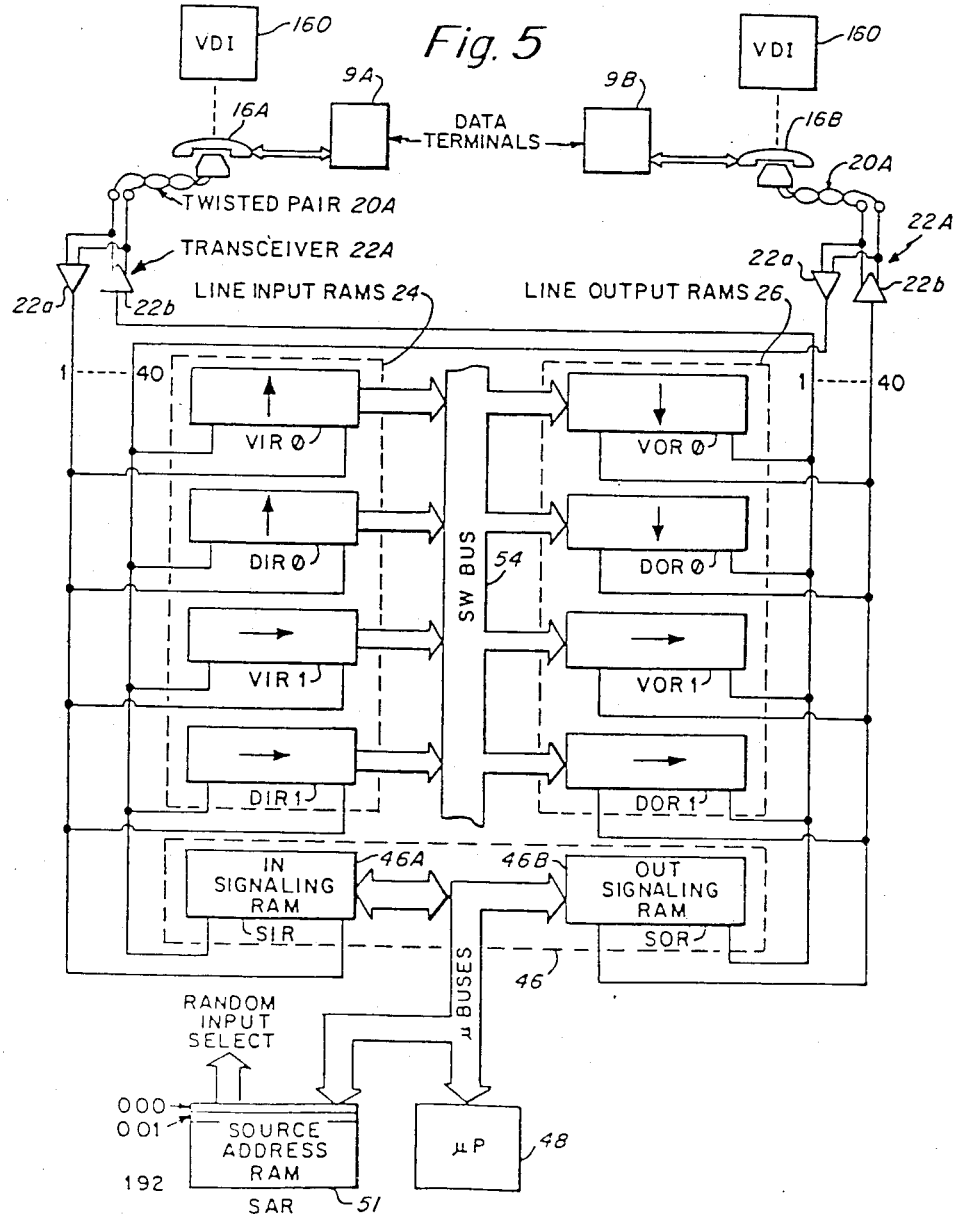
FIG. 5 is a simplified block diagram of the PABX system.

In FIG. 5 we show the first and fortieth of the 40 transceivers 22A provided at the local PABX for reception and transmission of serial bit stream messages from 40 telephone/data subscriber telephones 16A and data terminals 9A. Note that because of the separation of transmission or communication time frames into separate time slots for TRANSMIT and RECEIVE, it is possible, in accordance with the invention, to connect together the input of the transmitter 22b of each transceiver 22A of each transceiver 22A. Furthermore, only one wire for each transceiver is thereby required to couple each transceiver to the input and output RAMS 24 and 26. This results in significant savings in circuit layout, power consumption and wiring when forty such transceivers are required at the PABX.

In step 1, word input from the telephone lines is written into Line Input RAMS 24. In step 2, the words stored in the Line Input RAMS 24 are transferred to Line Output RAMS 26 and in step 3 of the switching process, the information in Line Output RAMS 26 is read out and transmitted to the 40 telephones.

II.1 STEP 1—INPUT FROM LINES

Figure 4:
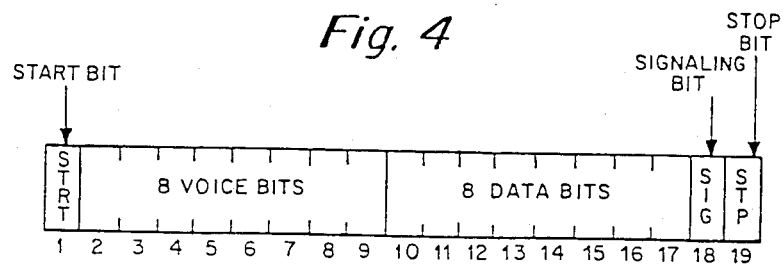
FIG. 4 is a representation of the word format for the data transmitted in accordance with the invention.

Referring now to step 1 in more detail; during the second half of each frame, each telephone sends a serial bit stream of information to the PABX. The bit stream word format is shown in FIG. 4 to consist of M bits, wherein M=16, comprising 8 bits of digitized voice sample in PCM companded form and 8 bits of data. NOTE: An additional two bits is used for start and stop information and one more bit for signalling. While this information is received by the local PABX, it is being written into three Line Input RAMS. The first voice bit for each phone is written in and stored in location $\emptyset\emptyset$ of Voice-Input-RAM-$\emptyset$ (VIR$\emptyset$) as a N-bit word. In this case, N=40 since in our exemplary embodiment 40 telephone subscribers are serviced over 40 twisted pair lines. This process is repeated for the second voice bit and stored in location $\emptyset$1. In all, this process is repeated eight times, filling VIR$\emptyset$, an 8×40 RAM.

The eight data bits, which follow, are stored in Data-Input-RAM-$\emptyset$ (DIR$\emptyset$) in exactly the same manner as the voice bits. The signalling bits, which also make up a 40-bit word, are stored in location $\emptyset\emptyset$ of the Signalling-Input-RAM (SIR). The SIR memory size is 8×40, which is filled up in 8 frames.

Unlike conventional RAMS, where the read and write formats are the same, these three input RAMs (VIR$\emptyset$, DIR$\emptyset$ and SIR) as well as the output RAMS (VOR$\emptyset$, DOR$\emptyset$ and SOR) operate with different read and write formats. The output, or read, format for VIR$\emptyset$ and DIR$\emptyset$ is 40 words with 8 bits each (for a read format of N(40) words×N(8) bits) In effect, these RAMs perform serial-to-parallel and parallel-to-serial conversion for each of the 40 lines. The parallel output is needed so that all eight bits of each line can be switched at the same time. These RAMs, called "orthogonal RAMs," will be described in detail in Section VII.

II.2 STEP 2—SWITCHING

The forty 8-bit word output from the VIR$\emptyset$ are transferred via SW bus 54 to its associated 40×8 Voice-Output-RAM-$\emptyset$ (VOR$\emptyset$). Locations in VOR$\emptyset$ are selected in numerical order and written into. The sequence in which VIR$\emptyset$ is read is determined by the read connection pattern. This read pattern is controlled by the Source-Address-RAM (SAR) 51. The contents of the SAR 51 are supplied by the microprocessor 48, which uses the incoming signalling information from the SIR for source-address computation. The identical procedure is used for data, where the DIR$\emptyset$ data bits are transferred to the Data-Output-RAM-$\emptyset$ (DOR$\emptyset$) over SW bus 54.

This transfer process is performed every 125-$\mu$s frame. Each frame is subdivided into 193 time slots by 1.544 megahertz clock pulses generated by a clock logic circuit 52 (FIG. 2) in PABX 10. These pulses are shown in curve A1 of FIG. 3B. Forty time slots are used to switch voice, forty for data, and the remaining are used for trunk, and other interfaces that will be explained later.

II.3 STEP 3—OUTPUT TO LINES

In the final step of the switching process, the information is read from the Line Output RAMs 26 and transmitted to the 40 telephones in half a frame. In order to do this, the information in the Line Output RAMs must be converted from parallel back to the serial format. This is accomplished with VOR$\emptyset$ and DOR$\emptyset$, which have the "orthogonal" write/read capability. VOR$\emptyset$ and DOR$\emptyset$ convert the input format from forty 8-bit words to eight 40-bit words.

The three-step switching process takes a total of 250 $\mu$s. In order to receive and transmit a frame every 125 $\mu$s, duplicate input/output RAMs are required. This is accomplished with VIR1, DIR1, VOR1, and DOR1, which interface with the aforementioned input/output RAMs, VIR$\emptyset$, DIR$\emptyset$, VOR$\emptyset$ and DOR$\emptyset$. Thus, when the RAMs with the $\emptyset$ suffix are in the receive/transmit mode, the RAMs with suffix 1 are in the voice/data switching mode. The arrows on the diagram indicate the two modes of operation.

It is important to note that writing into and reading out from output RAM locations, and writing into the input RAM locations is always performed in the same numerical sequence. The only variable in the switching process is the reading sequence of the input RAMs.

III. CALL INITIATION

The procedure for establishing a connection will now be explained by tracing the initiation of a call from the telephone or the data terminal. When neither the telephone nor the data terminal of a line is in use, a voice-data integration (VDI) chip 160 inside the telephone instrument (FIG. 5) is powered down and dissipates negligible power. When the telephone receiver handset is picked up or when the data terminal is activated, the VDI chip forms an 8-bit signalling message, which indicates that service is requested. This message, however, is not sent out until a "request for signalling information" (RSI) is received from the PABX over the telephone line. The PABX sends an RSI signal to all lines every 50 ms, as will be explained in greater detail in connection with FIG. 25. The RSI signal is generated by SOR (46B) and consists of the first bit of the 9-bit pulse train from SOR 46B. The signalling protocol is that the first bit from SOR 46B is always a zero followed by the 8-bit signalling message to the phones 16.

An asynchronous receiver in the telephone VDI chip 160 detects the start bit of the 19-bit message from the PABX and activates a crystal-controlled clock, which is very close in frequency to that of the PABX clock. Nineteen of the VDI's clock pulses are used to read in the bit stream from the PABX. Although the clock pulses are not perfectly synchronized with the incoming bit stream, their stability for recovering 19 bits of information is adequate. Bit 19 of the received word is a stop bit, which is used to resynchronize the VDI clock for transmission to the PABX.

The VDI chip 160 transmits to the PABX 19 bits with the format of FIG. 4 as explained earlier. The delay between the telephone and PABX is short compared to the bit-time duration. Consequently, the PABX clock can be used directly to recover the incoming bit stream. It thus eliminates the need for 40 on-chip asynchronous receivers with their associated chip area and power dissipation. This system works for a distance of up to several hundred feet.

The recovered voice and data bit stream is written into the input RAMs 24 and the signalling bit into the Signaling-Input (SIR) RAM. The Signaling-Input-RAM is updated every 50 ms, after which time the microprocessor 48 reads it, determines the outgoing signalling information, and stores the result in the Signaling-Output-RAM (SOR). Thus, status updates from the telephones are received and detected every 50 ms.

When the microprocessor 48 reads the SIR and detects an off-hook status, it loads an 8-bit message into the Output-Signaling-RAM (SOR). The SOR is also an orthogonal RAM, which converts the 8-bit message to a serial format for transmission to the telephones. After being received by the telephone's VDI chip, the decoded message activates an on-chip dial-tone generator at the telephone.

IV. CALL PROCESSING

After the caller receives a dial tone, dialing can be started. The dialed number is stored in the VDI chip 160 until a "Request for Signalling Information" is received, which initiates transmission of the dialed number to the PABX. The number is received by the SIR a digit at a time, and then read by the microprocessor 48. The microprocessor 48 analyzes this information and performs the following tasks:
1. It checks the SAR 51 to determine if the SAR RAM location of the called party is in use, thus determining whether the line is busy.
2. Assuming that the called line is free, the number of the caller is stored in the called party's SAR location.
3. It sends a ring message to the called party, and a ring-back message to the calling party via the signalling bit.

If in task (1) a busy is detected, then task (2) is skipped and in task (3) a "busy" message is sent out to the calling party.

V. INTERFACE TO CENTRAL/TELCO

The interface to the central switch or telephone company is at a T1 trunk rate of 1.544 Mb/s full duplex. Each 125-µs frame carries 24 64-kb/s channels, which are subdivided as follows: 21 for voice, 2 for data subchannels, and 1 for signalling.

Figure 7:
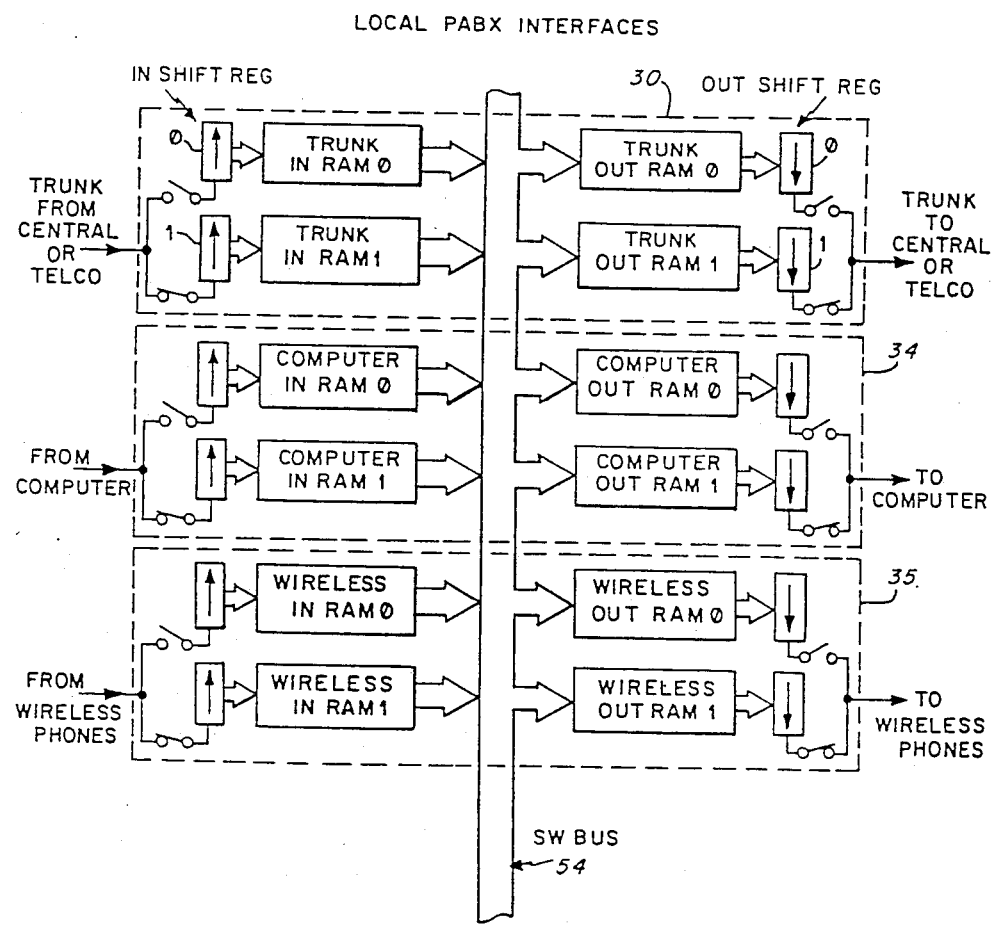
FIG. 7 is a simplified block diagram of the interface between a local PABX and a trunk to the central PABX or to the telephone company.

The FIG. 7 diagram shows various interfaces for connections outside the local PABX area. The SW Bus 54 of FIG. 7 connects with the SW Bus 54 of FIG. 5. The first eight bits of a frame in the incoming serial bit stream from the central PABX or TELCO on the trunk are shifted into Trunk In-Shift-Register-∅. After the shift operation is complete, the shift register contents are transferred in parallel to the first location of Trunk In-RAM-∅. This operation is performed 24 times, and the In-Shift-Register-∅ contents are stored in numerical order in locations of Trunk In-RAM-∅, taking a total period of 125 µs. During the next 125 µs, the contents of Trunk-In-RAM∅ are switched to the appropriate locations of VOR∅, DOR∅, VOR1 and DOR1 in FIG. 5. During the same 125 us frame, 24 bytes from the trunk are stored in In-shift-register-1, and then transferred as above to Trunk-In-RAM-1. The use of duplicate RAMS thus makes it possible to receive a continuous bit stream from the trunk while the information is being switched.

Transmission to the trunk employs the same principle of duplicate RAMs and shift registers. In this case, inputs VIR∅, DIR∅, VIR1 and DIR1 of FIG. 5 are stored in the Trunk-Out-RAMs as directed by the Source-Address-RAM (SAR) 51.

Figure 6:
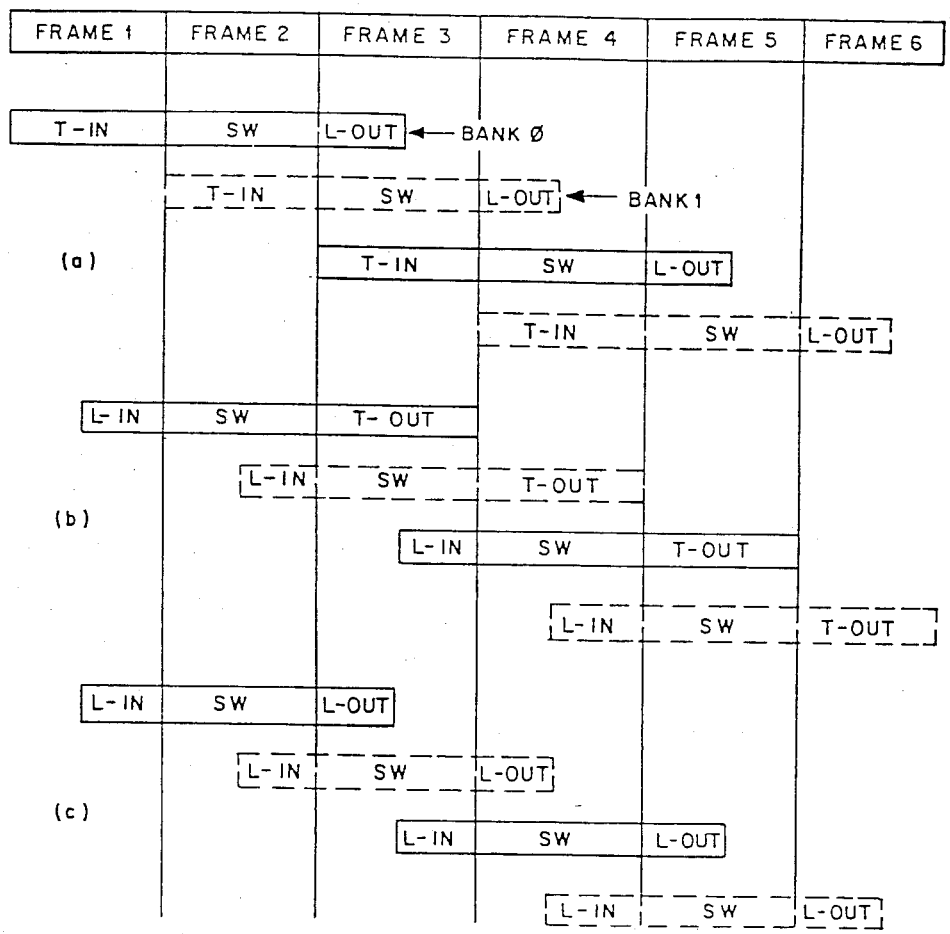
FIG. 6 illustrates the time allocation for switching and communication from (a) the trunk to the line, (b) the line to the trunk and (c) the line to the line within a PABX area.

The time allocation for trunk interface/switching in relation to interface/switching within the local PABX area is shown in FIG. 6. The diagrams illustrate the three situations of communications from (a) trunk-to-line, (b) line-to-trunk and (c) line-to-line. The interleaved usage of double banks of RAMs ∅ and 1 is illustrated with solid (Bank ∅) and dotted lines (Bank 1).

Thus, during the entire Frame 1, information from the Trunk is being coupled to the PABX Trunk in RAM 1 and during the second half of Frame 1, information from the phones is read into Bank ∅ of Line-Input-RAMs 24 of FIG. 5. During Frame 2, switching occurs in all the Bank ∅'s, Trunk information is being written into Bank 1 and during the second half of Frame 2, information from the phones is written into Bank 1 of Line-Input-RAMs 24. In the first half of Frame 3, Bank ∅ is read out and Bank 1 is switched. This process continues for 6 frames and then repeats.

As shown in FIG. 7, optionally switching to a computer or to wireless phones may also be provided using the same technique as that for a Central/Telco trunk switching. In this case, pairs of input and output computer and wireless RAMS are provided for input/output interfacing.

Switching to the various outputs is subdivided into 193 time slots as assigned in Table I below. Thus, every output RAM location has a predetermined time slot during which it receives information. The variable in the switching process is the source address, which is stored in the source-address-RAM.

TABLE I

| Time Slot Assignments | |
|---|---|
| | Time Slots Range |
| Conference (optional) | 2–7 |
| Computer Output RAMs | 11–18 |
| Data Output RAMs | 51–90 |
| Voice Output RAMs | 91–130 |
| Trunk Output RAMs | 131–170 |
| Wireless Output RAMs | 181–185 |
| Spares | 1, 8–10, 19–50, 174–180, 186–193 |

VI. SIGNALING SYNCHRONIZATION

Since initiation of signalling occurs at a random time, and all signalling words must arrive at the same time to be written into the Signalling-Input-RAM, synchronization between telephone signalling is required. This is achieved with the RSI or request-for-signalling-information command from the PABX sent by the SOR 46B of FIG. 5. In response to this command, all VDI telephone chips 160 (FIG. 5) send their signalling words at the same predetermined time, allowing direct writing into the Signalling-Input-RAM. The Signalling-Input-RAM is examined by the microprocessor 48 every 50 ms to determine the required action. This synchronization technique provides considerable hardware simplification on the PABX chip.

VII BASIC OPERATION—EXAMPLE

Switching over the trunk and via a central switch will be illustrated with the following example taken in connection with FIG. 8. Assume that telephone line 3 of local PABX #2 is calling over line 15 of local PABX #7. The connection is initiated when the microprocessor 48 in PABX #2 reads the In-Signalling-RAM 46a (FIG. 5) and determines that a connection outside the PABX is desired.

The microprocessor in PABX #2 assigns to the call a free trunk channel (assume #135) and sends appropriate information via the signalling channel to the central switch 12 of FIG. 1, which routes the signalling information to PABX #7. After the microprocessor 48 in PABX #7 determines that line 15 is not busy, it assigns to the call a free trunk channel (assume #140) and informs PABX #2 that a connection has been established.

In the process of establishing a connection, the two local PABXs update their respective Source-Address-RAMs as indicated in FIG. 8. From this point on, the two source address RAMs are in complete control of switching. The microprocessors can then perform other functions, such as maintenance and monitoring the input signalling RAMs every 50 ms.

VIII. Orthogonal RAMs

As previously noted, the apparatus of the present invention takes advantage of one of the attractive features of digital communication, i.e., the ability to Time Division Multiplex (TDM) many information channels without deteriorating transmission quality. TDM provides an efficient means of utilizing the transmission bandwidth, especially in optical fibers that can accommodate hundreds of channels on a single fiber. The ability to transmit many channels, simultaneously, creates a correlary need for electronic circuits which can receive the many channels of information and combine and separate these many channels of information at high speed and with high reliability.

Figure 9:
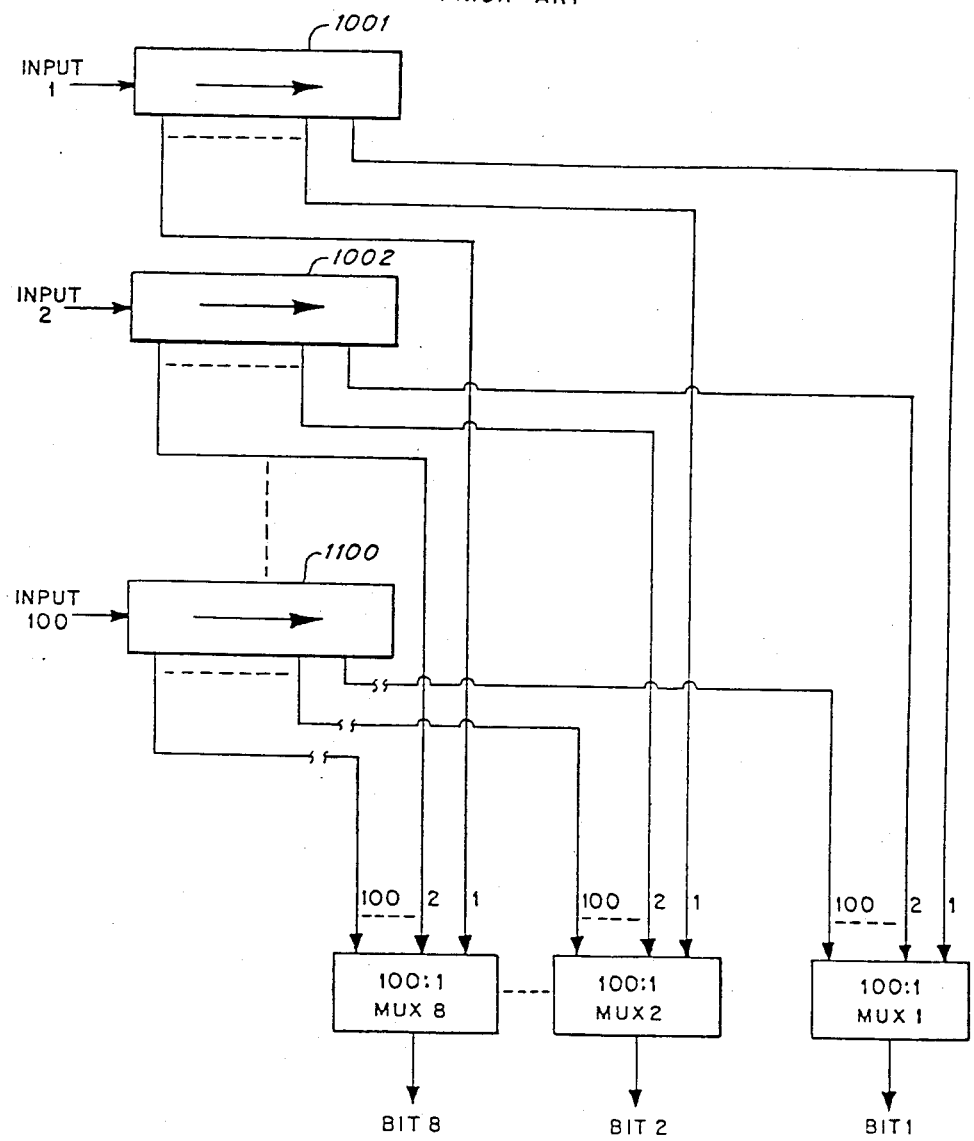
FIG. 9 is a simplified block diagram of the conventional TDM multiplexer of the prior art.

The conventional technique for implementing TDM functions is illustrated in FIG. 9, which shows an example of 100 input lines of digital bit streams labelled input 1, 2 - - - 100 being multiplexed to a common 8-bit bus. Multiplexing is accomplished by first shifting in 8-bits from each line of the stream into 100 separate shift registers 1001, 1002, - - - 1100. The parallel output of each of the 100 shift registers is then combined in 8 multiplexors labelled MUX 1-MUX 2 - - - MUX8, each having 100 inputs. Multiplexors of this size are complex to interconnect and consume considerable power and chip real estate, thereby making them inefficient for VLSI implementation.

In the apparatus of the present invention, multiplexing and demultiplexing are accomplished by a device which we call an orthogonal memory array or an orthogonal RAM. The device provides storage, shifting, and multiplexing in a highly regular and dense structure. This results in higher speed, reduced power, and reduced chip real estate, thus making it practical for VLSI implementation.

The three functions required for reception of a TDM digital bit stream, namely, storage, serial-to-parallel conversion, and multiplexing, are all performed in a memory structure that in the preferred embodiment writes information in one direction, i.e., the X direction, and reads out orthogonally in the Y direction.

Figure 10:
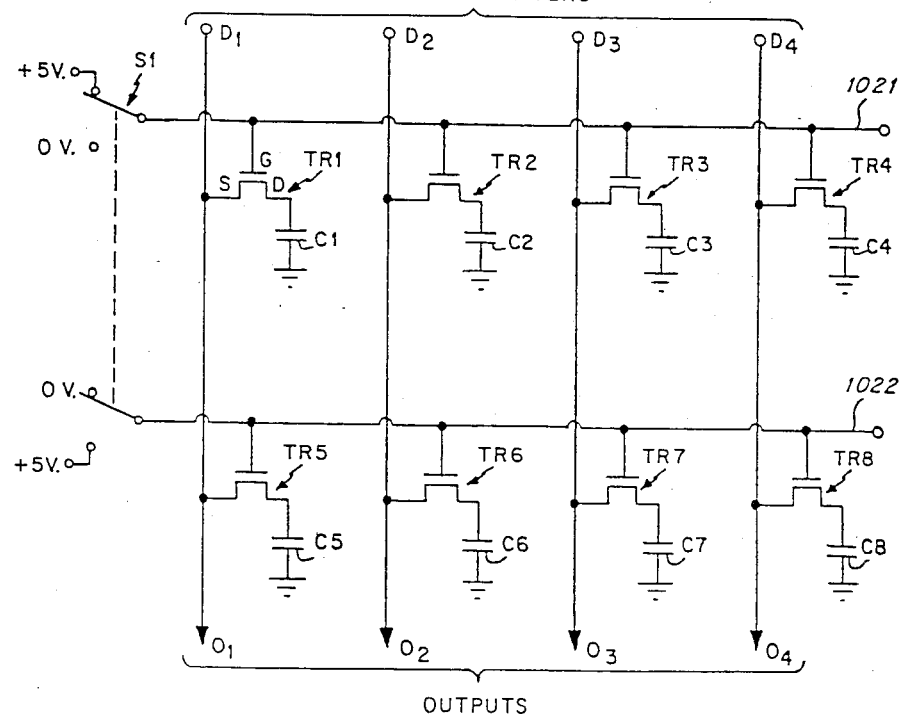
FIG. 10 is a schematic diagram of a conventional dynamic MOS RAM organization of the prior art.

Before explaining the orthogonal operation of the present invention, it may be helpful to briefly review the read/write process of a conventional memory structure. FIG. 10 shows a conventional dynamic MOS RAM in which the bit information data is stored on capacitors C1-C8. In the memory of FIG. 10, a plurality of MOSFET transistors TR1-TR8 are arranged in rows and columns in which the gate electrodes "G" are coupled to Read/Write lines 1021 and 1022 while the source electrodes "S" are coupled to Data Input lines D1-D4. The drain electrodes "D" are each coupled to one side of respective capacitors C1-C8; the other side of which is grounded. This memory operates as follows: read/write line 1021 is switched by switch S1 to +5 volts while all the other read/write lines (in this simple case line 1022) are at zero volts. This turns on only the first row of MOS transistors TR1-TR4, permitting current to flow through transistors TR1-TR4 and causing the capacitors C1-C4 to charge with the instantaneous voltages present on input lines D1 through D4, respectively.

When write line 1021 is returned to zero volts by S1, the charge is retained in the first row of capacitors C1-C4. This process is repeated by switching read/write line 1022 to +5 volts causing the next data bits on the data lines D1 through D4 to be stored on the second row of capacitors C5-C8. Reading is accomplished by disconnecting the drivers (not shown) from lines D1 through D4 and successively activating read/write lines 1021 and 1022 by switching the lines to +5 V which causes the stored capacitor charges to appear on lines D1 through D4. Thus a row of stored data is read out one row at a time. In such prior art devices, the storage or memory device can only be addressed (read or written) from one line or direction, i.e., the horizontal read/write lines.

Figures 11, 12:
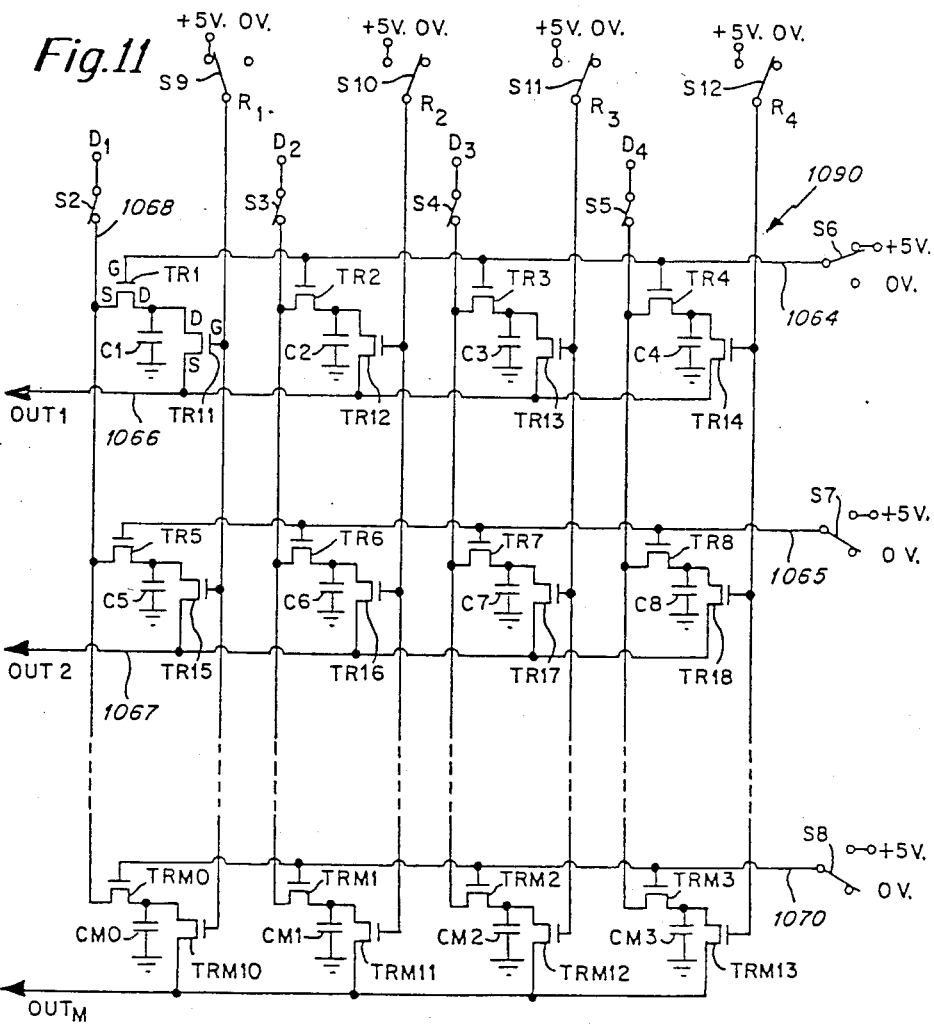
FIG. 11 is a schematic of an orthogonal RAM organization for multiplexing in accordance with the invention.
FIG. 12 is a diagramatic representation of the orthogonal RAM utilized for parallel-to-serial conversion.

In contrast, the operation of the orthogonal memory is illustrated in FIG. 11. Here, writing is accomplished as in FIG. 10 by switching horizontal lines. However, reading is accomplished by switching vertical lines so that reading is orthogonal to writing. Thus, when a read line R1-R4 is switched to +5 volt, one *column* of stored data is read out at one time. In this fashion, M words each N bits may be written into the memory, and one bit from each word may be read out at the same time. The read-out thereby becomes N words each having M bits.

As shown in FIG. 10, four data input lines D1-D4 are connected through switches S2-S5 to N columns of write transistors wherein N is a number corresponding to the number of input words or data lines D1-D4, i.e., 4. Line D1 is connected to a column of M write transistors TR1, TR5 and TRM0 wherein M is a number corresponding to the number of bits in a data input word. Similarly, line D2 is connected to M write transistors TR2, TR6 and TRM1. Writing is accomplished in the conventional manner by sequentially switching rows of write transistors to 5 volts via switches S6-S8, coupled to write lines 1064, 1065 - - - 1070, causing capacitors C1-C4, C5-C8 and CM0-CM3 to sequentially charge to the digital voltages present in the digital bit stream at lines D1-D4.

In the orthogonal memory depicted in FIG. 11, an additional set of transistors, i.e., read transistors TR11-18, TRM10-TRM13 is provided. The read transistors are coupled in series with the write transistors on one side of the memory capacitors such that the drain electrode D of each each read transistor is coupled to the same side of the memory capacitor while the other side of the capacitor is grounded. The gate terminal G of each read transistor is coupled to respective N columns of read lines R1-R4 and the source terminal to M rows of output lines OUT1-OUTM. Thus, during "read" operation switches S2-S5 disconnect the input data lines D1-D4 and each column of read lines R1-R4 is sequentially switched to +5 V by switches S9-S12. The +5 volts on lines R1-R4 enable read transistors TR11-TR18 and TRM10-TRM13 which permit the charges stored on each column of capacitors, i.e., C1, C5 - - - CM0 of column 1 to be outputted or "read" on respective output lines Out 1, Out 2, and Out M. In this fashion, one column of stored data is read out at one time.

In summary, therefore, the orthogonal memory permits M words of N bits in length to be written into memory and one bit from each word, (N words of M bits) to be subsequently simultaneously read out.

While the switching for the orthogonal memory has been depicted by electromechanical switches, it should be understood that in practical implementation, bit shift registers or other well-known techniques for successive switching, may be substituted therefore.

Figures 13, 14:
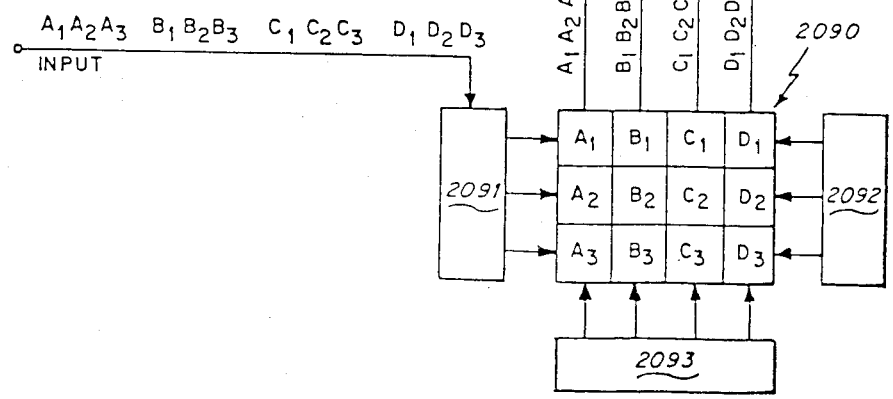
FIG. 13 is an illustration of the contents of the memory and shift registers of FIG. 12 during multiplexing.
FIG. 14 is a block diagram representation of the orthogonal RAM of the invention utilized for serial-to-parallel conversion in multiplexing.

FIGS. 12 and 13 illustrate the use of orthogonal memory for time-division multiplexing. Four serial bit streams labelled SBS1-4 consisting of N words each M bits long $A_1 A_2 A_3$, $B_1 B_2 B_3$, $C_1 C_2 C_3$, and $D_1 D_2 D_3$, respectively, are written into the rows of the orthogonal RAM 1090 (such as the orthogonal RAM shown in FIG. 11) in the sequences of the subscripts utilizing switching signals from row decoder 1092 which may comprise, for example, a bit shift register. Note: In this simplified example, M is 3 and N is 4. The RAM 1090 is then read out by columns in alphabetical sequence utilizing switching signals from column decoder 1093 (another bit shift register) and is loaded into a shift register 1091 as a function of time. Thus, as shown in FIGS. 12 and 13, during time interval $T_1$, bits $A_1$, $B_1$, $C_1$, and $D_1$ are written into the first row of RAM 1090. During time interval $T_2$, bits $A_2$, $B_2$, $C_2$, and $D_2$ are written into the second row and so on. At the end of time period $T_3$, the memory is filled.

During time interval $T_4$, the first column in the memory array 1090, containing bits $A_1$, $A_2$, and $A_3$, is transferred in parallel to the shift register 1091. The contents of the shift register are shifted out bit-by-bit during $T_5$ and $T_6$. This process is repeated for the B, C, and D bits. It can be seen that during time intervals $T_4$ through $T_{15}$, the output sequence from the shift register 1091 is $A_1A_2A_3B_1B_2B_3C_1C_2C_3D_1D_2D_3$. Thus, the output stream is a time-division multiplexed version of the four input streams. It should be noted that time intervals $T_1$, $T_2$, and $T_3$ can be of different duration than time intervals $T_4$ through $T_{15}$.

The operation for demultiplexing is similar to multiplexing, as shown in FIGS. 14 and 15. In demultiplexing, the inputs are written in a column at a time while reading is accomplished on a row basis. The implementation is the same as in FIG. 12 if all arrows are reversed. The multiplexed input stream is inputted into the shift register 2091 which is read out in parallel and written into the memory array 2090 one column at a time as illustrated in FIGS. 14 and 15.

It should be noted that with two transistors per memory cell, there is an input-output symmetry in the array so that the same array can be used for multiplexing and demultiplexing by reversing the direction of the shift register.

Figure 16:
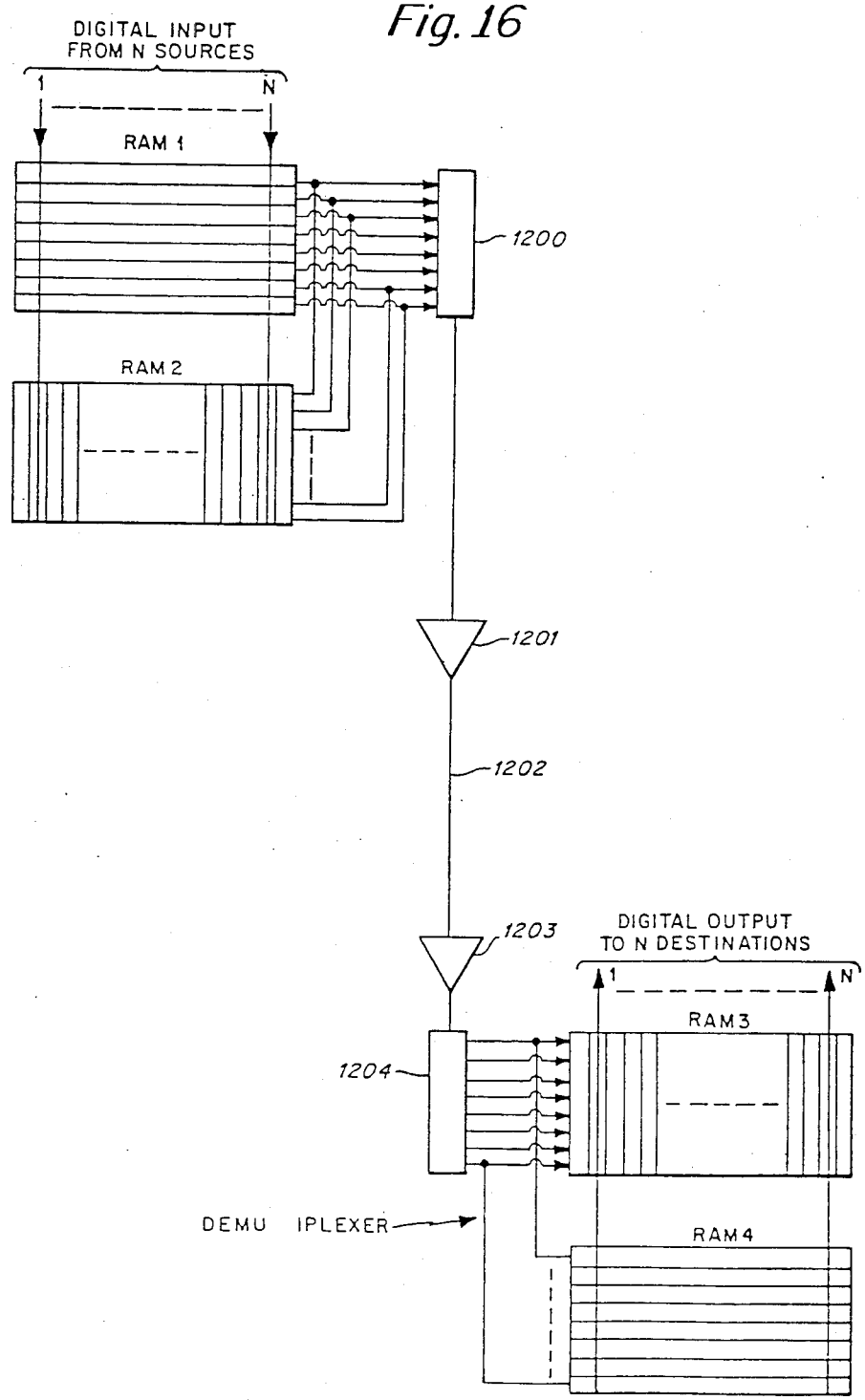
FIG. 16 is a block diagram illustrating the use of orthogonal RAMs in accordance with the invention for communication links.

To accommodate continuous input bit streams and at the same time provide a continuous output stream, a second multiplexor is required. FIG. 16 illustrates the use of the orthogonal memory array in time-division digital communication and also the use of dual orthogonal RAMs 1 and 2 to provide such a continuous output stream. In the apparatus shown in FIG. 16, bit streams of M bits each from N sources are multiplexed in orthogonal RAMs in a dual multiplexor configuration of RAM1 and RAM2.

The outputs of RAM1 and RAM2 are coupled together as inputs to shift register 1200. While RAM1 is being written into on a row basis during one frame, RAM2 is being read out on a column basis. In the next succeeding frame, the roles of RAM1 and RAM2 reverse. This double memory arrangement provides a continuous flow of information. The multiplexed information from RAMs 1 and 2 is buffered in an M-bit shift register 1200 to provide parallel-to-serial conversion for multiplexed transmission.

The multiplexed information is amplified and transmitted by driver 1201 over a transmission line, i.e., optical fiber 1202 to receiver 1203. The received multiplexed TDM bit stream is converted from serial to M-bit parallel form in register 1204 and is written into orthogonal RAM3 or RAM4. Assuming that RAM3 is being written into, the M-bit bytes enter on a column basis. At the same time, RAM4 is read out on a row basis and supplied to N destinations.

Two-way communication can be provided by duplicating this arrangement so that each end performs multiplexing and demultiplexing, as previously illustrated in the embodiment of FIG. 5 and, more specifically, by the two Line-Input-RAMs VIR∅ and VIR1 and two Line-Output-RAMs VOR∅ and VOR1. It should also be noted that by making the vertical addressing random, a destination can select an arbitrary source. By making the horizontal addressing random, a change in information format can be implemented.

There is thus provided a memory array which performs time-division multiplexing and demultiplexing using a regular and compact structure. The memory performs storage as well as serial-to-parallel or parallel-to-serial conversion. This is achieved by reading the RAM in an orthogonal direction to the write operation. By combining this RAM with a high-speed transmission media (i.e., optical fiber), many channels can be communicated over a single line. Due to its regular structure, this apparatus lends itself to efficient VLSI implementation and to redundancy techniques used with the regular structures of memory arrays.

IX. LOW POWER LINE DRIVING

As shown in FIG. 2, transmission between the local PABX chip 10 and the local subscribers is achieved using a differential transceiver 22 coupled by twisted wire pairs 20. The details of such transmission, in accordance with the invention, will now be described in connection with FIG. 17.

Figure 17:
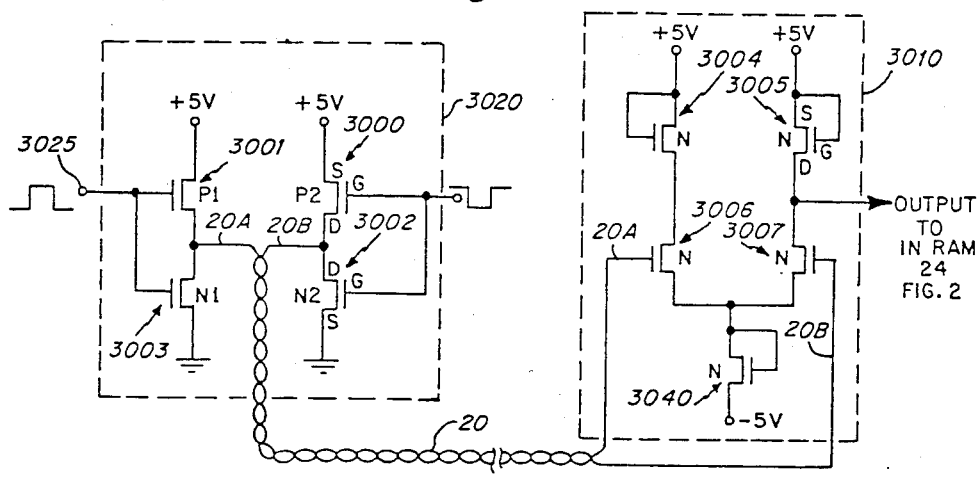
FIG. 17 is a schematic of the line low-power line drivers of the invention.

FIG. 17 shows a differential transceiver 3010 at the receiving end, i.e., the PABX end, and a differential driver 3020 at the sending end, in this case, the telephone subscriber's end. However, it is to be understood that the two ends are interchangeable. The differential driver 3020 consists of two P/N MOS transistor pairs 3001 and 3003, forming one pair, and 3000 and 3002, forming the second pair. The source terminal of transistors 3000 and 3001 is coupled to +5 volts and the source terminal of transistors 3002 and 3003 is coupled to ground. Twisted wire transmission line 20 has one wire 20A coupled to the intersection of the drain terminals of respective transistors 3001 and 3003, while the drain terminals of respective transistors 3000 and 3002 are coupled to the other wire 20B. The information bit stream at terminal 3025 is coupled to the gate terminals of transistors 3003 and 3001 and the negative or reciprocal of the bit stream is coupled to the gates of transistors 3000 and 3002, thereby differentially driving the transistor pairs and hence the transmission line 20.

Figure 18:
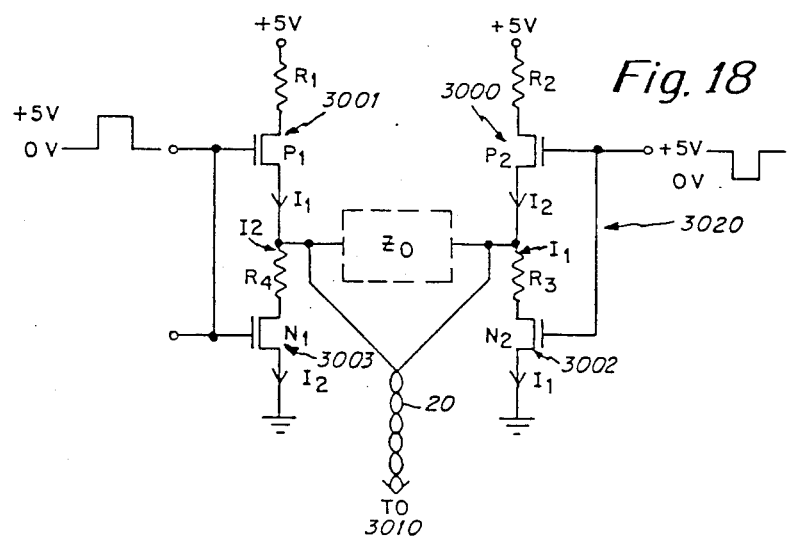
FIG. 18 is an equivalent circuit of the circuit shown in FIG. 17.

The equivalent circuit for the differential line driver 3020 of FIG. 17 is shown in FIG. 18. The two figures may be used to show that the sending end termination circuit line driver dissipates power only during logical transitions of the input signals on the wires 20a and 20b, comprising the wire pair 20.

The receiving end of transmission line 20 is coupled across the gates of N-MOS transistors 3006 and 3007, which present a high input impedance, thus effectively providing an open circuit at the receiving end.

The characteristic impedance $Z_0$ of line 20 is typically 100 ohms. The transistor pair geometries are selected to provide a drain-source resistance of $\frac{1}{2} Z_0$ or 50 ohms. The line driver 3020 sending end circuit has a source impedance of 100 ohms matched to the line impedance $Z_0$; and is thus considered to be terminated at the sending end. The result of this arrangement is summarized in Table II below:

TABLE II

| | Sending End Termination | |
|---|---|---|
| Time | Sending End | Receiving End |
| $0 < T < T_D$ | $V = \frac{EZ_0}{R + Z_0} = \frac{E}{2} = 2.5 \text{ V}$ | $V = 0$ |
| | $I = \frac{E - E/2}{R} = \frac{E}{2K} = 25 \text{ mA}$ | $I = 0$ |
| $T_D < 1 < 2T_D$ | $V = \frac{E}{2} = 2.5 \text{ V}$ | $V = 2 \times E/2 = E$ |
| | $I = \frac{E}{2R} = 25 \text{ mA}$ | $I = 0$ |
| $2T_D < 1 < T_W$ | $V = E$ | $V = E$ |
| | $I = \frac{E - E}{E + Z_0} = 0$ | $I = 0$ |
| $0 < 1 < T_W$ | Average Power Dissipation (Sending and Receiving) | |
| | $= (5 \text{ V} \times 25 \text{ mA}) \times \frac{2T_D}{T_W} = 23.4 \text{ mW (max length)}$ | |
| | $= \frac{1}{2} \times 23.4 \text{ mW} = 11.7 \text{ mW (average length)}$ | |
| | $= \frac{1}{2} \times 11.7 \text{ mW} = 5.85 \text{ mW (average length)}$ 50% transmit 50% receive | |

Under the above conditions, assume that the one-way transit time for a signal sent from the sending end (driver 3020) to be received at the receiving end (transceiver 3010) is $T_D$; and that the round trip transmit time for the transmit signal to be sent and reflected back to the driver is $2T_D$; then during the time "t" is smaller than $2T_D$ the transmission line appears infinitely long to the transmitter circuit (driver 3020) causing only half of the driver voltage E to be applied to the line. This is because the output impedance seen by the driver during this time period $t < 2T_D$ is $Z_0$, thus a 2:1 attenuator is formed by the ratio of the line impedance $Z_0 = 100$ ohms and the internal impedance of driver 3020 = 100 ohms. Thus, assuming a driver voltage of 5 volts, at a time, $t < 2 T_D$; the voltage V on the line 20 is 5/2 or 2.5 volts, as shown in curve A of FIG. 19.

Figure 19:
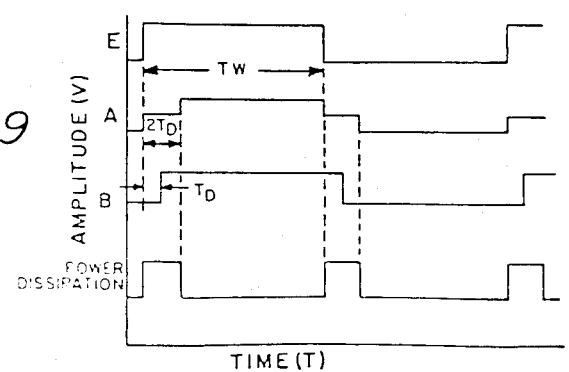
FIG. 19 is a timing diagram showing the waveforms at certain points of time and as propagated along the transmission line 20 of FIGS. 17 and 18.

When this voltage V of 2.5 volts arrives at the receiving end (driver 3020) at time $t = T_D$, the open circuit at the receiver end causes V to double to 2 x E/2 or 5 volts and return to the sending end as shown in curve B of FIG. 19.

When the reflection from the receiving end arrives at the sending end at $t = 2T_D$, the transmission line voltage V at that end becomes E/2+E/2=E, or 5 volts, reducing the current and power into the line to zero at $t = 2T_D$ since current cannot flow without a voltage difference across the line and, as shown in curves A and B, the voltage at both ends at $2T_D < t < T_W$ is the same. During a time period less than the transmitted pulse width, $T_W$, of 3.2 us, the power dissipation is 23.4 mW for a line length of 300 feet. Line attenuation, which is small, is neglected in this example. The resulting crosstalk into an adjacent twisted pair in the same sleeve is several millivolts but this can be tolerated by the line, which has a 5 volt noise immunity when driven differentially with a 0V to +5 V logic signal.

It should be emphasized that the line driver 3020 dissipates power only during logical transitions, at which time the driver delivers current to charge or discharge the line 20. As may be seen in FIG. 18, current $I_1$ flows through $R_1$, $P_1$, $Z_0$, $R_3$ and $N_2$ to ground to charge the line represented by $Z_0$; whereas for discharge current $I_2$ flows from +5 V through $R_2$, $P_2$, $Z_0$, $R_4$ and $N_1$ to ground.

In FIG. 17 the N transistor 3040 of receiver 3010 forms a current source which is switched between the two N transistors 3006 and 3007 connected to the twisted pair 20. In FIG. 18, resistors R1-R4 represent the stray resistances of the driver 3020 transistors which provide the output impedance to match the line impedance $Z_0$.

X. TWO WIRE BIDIRECTIONAL TRANSMISSION

In the transmission circuit described in connection with FIGS. 17-19 transmission in one direction occurred during one frame and in the other direction in another frame. In the following alternate embodiment, transmission and reception of signals is provided over the same pair of wires at the same time.

Figure 20:
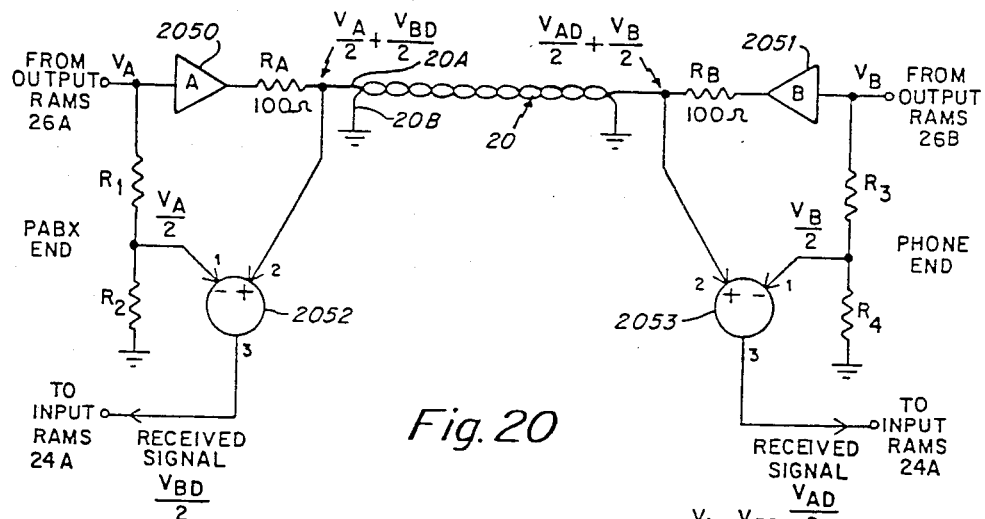
FIG. 20 is a schematic diagram of a bidirectional transmission circuit in accordance with the invention.

The circuit for this two wire bidirectional transmission circuit is shown in FIG. 20 to comprise a line driver 2050 at terminal A; and a line driver 2051 at terminal B. Note that terminal A may comprise the PABX of FIG. 2 and terminal B the telephones of FIG. 2 or vice versa. The output of line driver 2050 is coupled through terminating resistor $R_A$ to line 20A of twisted pair 20. $R_A$ has an impedance of 100 ohms matched to the impedance $Z_0$ of line 20. Likewise, line driver 2051 at terminal B is coupled through impedance matching resistor $R_B$ to line 20A of twisted pair transmission line 20. The remaining line 20B of the pair 20 is grounded at both ends, as shown.

The A terminal end of line 20A is also coupled to the plus terminal of a subtracting circuit 2052. The negative terminal of subtractor 2052 is provided with an input voltage VA/2 from the midpoint of a voltage divider network comprising R₁ and R₂ coupled in series between ground and the input terminal of line driver 2050.

Similarly, the B terminal end of line 20A is coupled to the plus input terminal 2 of subtractor 2053, while the negative input terminal 1 is coupled to the midpoint of a voltage divider network comprising resistors R₃ and R₄ which divides the input voltage VB at the input to line driver 2051 in half, i.e., VB/2. The output at terminal 3 of subtractors 2051 and 2053 is the linear vector difference between the inputs at terminals 1 and 2.

The input to line driver 2050 may comprise a bit stream of digital pulses of amplitude VA, such as the bit stream from RAMS 26 of FIG. 2, while the received signal VBD/2 may comprise the input bit stream to the input RAMS 24 of FIG. 2.

The circuit of FIG. 20 takes advantage of the fact that:
(a) the transmitted and received signals add linearly at each end of the transmission line 20, and
(b) the transmitted component can be recreated and subtracted from the combined signal to provide the received component.

The output from driver 2050, VA, is attenuated by a factor of two since $R_4$ and $Z_0$ form a 2:1 attenuator. Similarly, the input from the B terminal on the right side of the line 20 is VB/2. When VB/2 arrives at the A side, it adds to the A driver signal VA/2 and the combined output at the A side of the transmission line 20 becomes VA/2+VBD/2 where VBD/2 is the delayed and attenuated version of VB/2. Similarly on the B side of the transmission line the voltage is VAD/2+VB/2, where VAD is the delayed and attenuated version of VA. By subtracting VB/2 from VAD/2+VB/2 in subtractor 2053 the desired received signal output VAD/2 is obtained.

The subtractors 2052 and 2053 must be linear since the two signals form an analog addition. One way of implementing such a subtractor is shown in FIG. 21.

Figure 21:
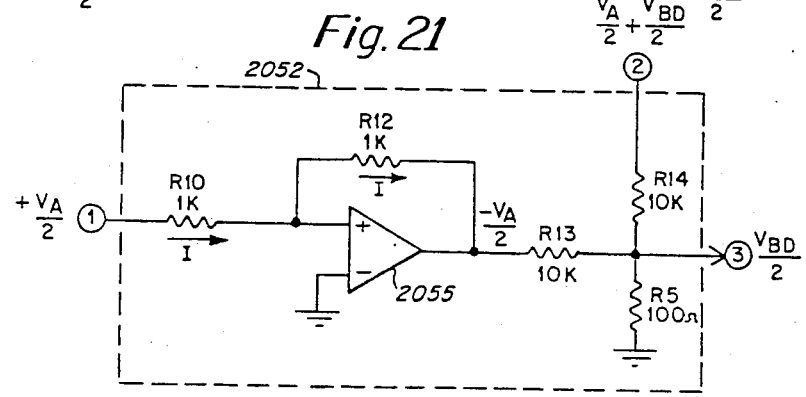
FIG. 21 is a schematic diagram of the subtractor circuit utilized in FIG. 20.

As shown in FIG. 21, the subtractor 2052 of FIG. 20 may comprise a high gain differential amplifier 2055 which provides at its output the negative of its input. Thus, the input to terminal 1, +VA/2, is coupled through R10 a 1000 ohm resistor to the plus terminal of amplifier 2055; while the negative terminal is grounded. The output of amplifier 2055 is fed back through R12, a 1000 ohm resistor to the plus terminal producing at the output terminal −VA/2. The signal −VA/2 is summed at R5 with the signal VA/2+VBD/2 at terminal 2. Summation occurs because R5 has a much smaller resistance (100 ohms) than R14 (10K ohms) and R14 equals R13. The resulting output at terminal 3 is thus VBD/2.

Figure 22:
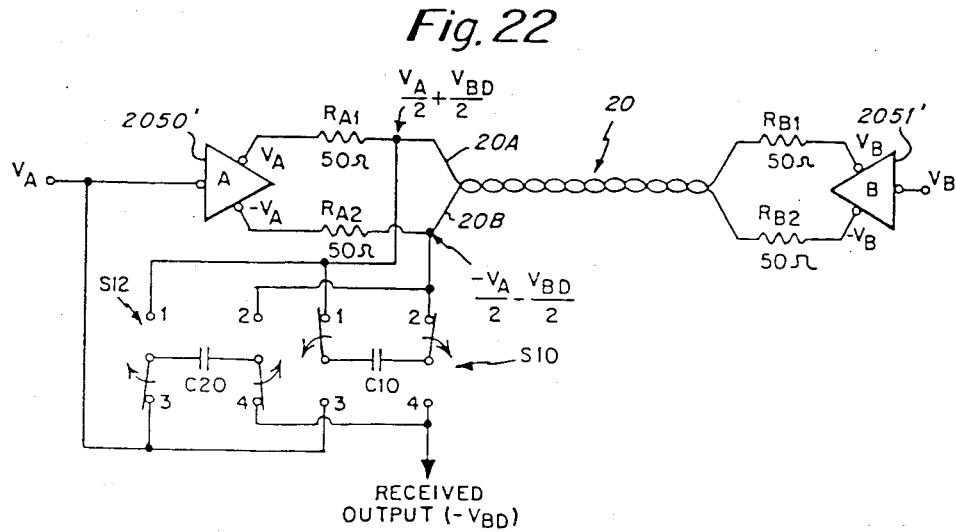
FIG. 22 is a schematic diagram of a bidirectional switching system with differential drive in accordance with the invention.

FIG. 22 shows how bidirectional transmission can be achieved with a balanced differential drive. In FIG. 22, a twisted pair 20 is being driven at each end by two differential drivers, 2050' and 2051'. The output impedance of each driver must equal the line impedance $Z_0$ for proper line termination. Operation is basically the same as in FIG. 20 wherein the input VA or VB is subtracted from the combined signals. However, due to differential operation, a different scheme is employed in obtaining subtraction.

This is accomplished by alternately switching capacitors C10 and C20 between terminals 1-2 and 3-4 by means of switches S10 and S12. For example, when capacitor C10 is connected across terminals 1-2, it charges with the differential line voltage. When C10 is then switched to terminals 3-4 the differential line voltage is subtracted from the terminal A input VA, thus providing −VB. During the time C10 is connected to terminal 3-4, C12 is being charged with the differential line voltage. The capacitors must switch at about 5 times the transmission bit rate. The switches S10 and S12 may preferably comprise MOS transistors which can be switched at the rates of several megahertz. Although not shown, the same circuit for subtraction is intended to be used at the B terminal side of the line 20 used on the right side of the line.

XI. TELEPHONE INTERFACE

Figure 23:
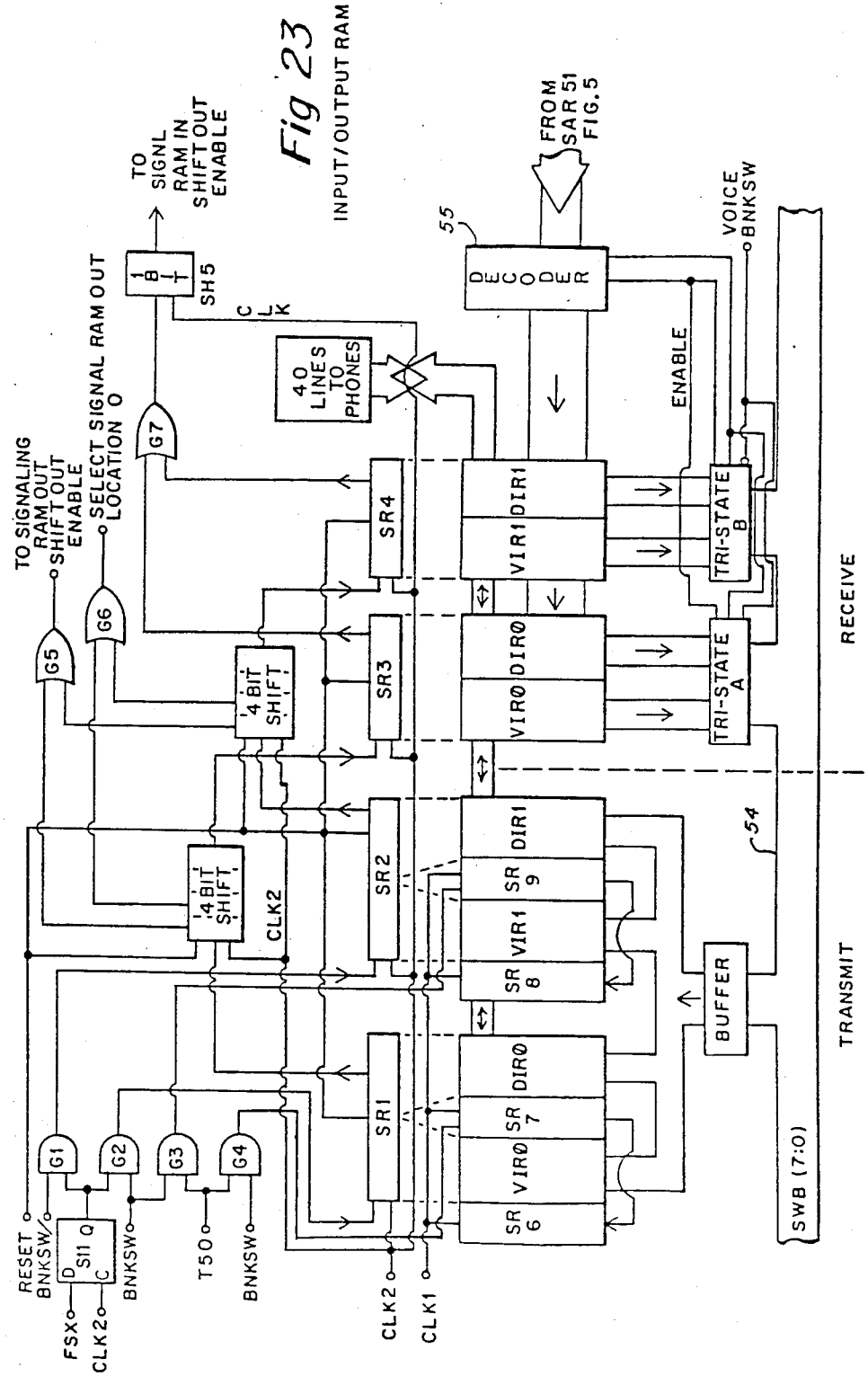
FIG. 23 is a block diagram of the input/output RAMs circuitry of the invention.

The logic for communications between the PABX and the subscriber's telephones is shown in FIG. 23. The blocks designated as VIR∅, VIR1, DIR∅, DIR1 are the voice and data orthogonal Line-Input-RAMs 24 of FIG. 5 which interface with the 40 telephone lines. Similarly, VOR∅, DOR∅, VOR1 and DOR1 are the Line-Output-RAMs 26 of FIG. 5 which also interface with the 40 telephone lines. Duplicate banks of RAMs VIR1, DIR1, VOR1 and DOR1 are provided, as explained previously, with one set being activated when Bank Switch (BNKSW) signal is a logical "1" and the other set being activated when BNKSW is a logical "0". The internal operation of the PABX chip is subdivided into 193 time slots (See FIG. 3B) which are activated with timing pulses T1 through T192 and a FXS signalling bit. Assume that the BNKSW signal is low at AND gates G1 and G4, then BANKSW/=1 at G2 and G3. This causes an FSX signal, delayed by one time slot, to be applied to shift register 1 from gate G2.

During a first CLK2 clock period, defined by CLK2 pulses of 3.238 microseconds duration (See curve A2, FIG. 3B), none of the memory locations in the RAMs are selected and the outputs of all 40 lines are, by design, in the high state. This causes a start pulse, curve B FIG. 3B, to appear on all 40 lines. During the next 16 CLK2 pulses, voice and data bits are transmitted. During pulse 18, transmit signalling is enabled; and, during pulse 19, a stop bit (zero) is transmitted. During CLK2 pulse 20, none of the RAM locations are addressed because of changeover from TRANSMIT to RECEIVE. During pulse 21, none of the RAM locations are addressed because the start pulse from the telephone is arriving. During pulse 22, the first output of shift register 3 is high, and the first voice bit is written into VIR∅. During the next 15 pulses, 7 additional voice bits and 8 data bits are written into the input RAMs. During CLK2 pulse 38, the signalling RAM (SIR FIG. 5) is enabled.

While the above is taking place, 40-bit shift register 9 has started propagating a "one" at T51; based upon an enable signal from G3 which is initiated by a T50 pulse; and 40 8-bit words of data are transferred from DIR1 to the DOR∅ locations as controlled by the SAR 51 (FIG. 5) through the decoder 55. Both voice and data are read out at the same time from Voice-Output-RAM-VOR∅ and Data-Output-RAM-DOR∅, but Tri-State switches A and B only allow voice or data to pass through to the switching bus SWB.

When BNKSW is high, the operation is the same except the roles of the Voice and Data-Input/Output-RAMs ∅ and 1 are interchanged.

XII. TRUNK INTERFACE

Figure 24:
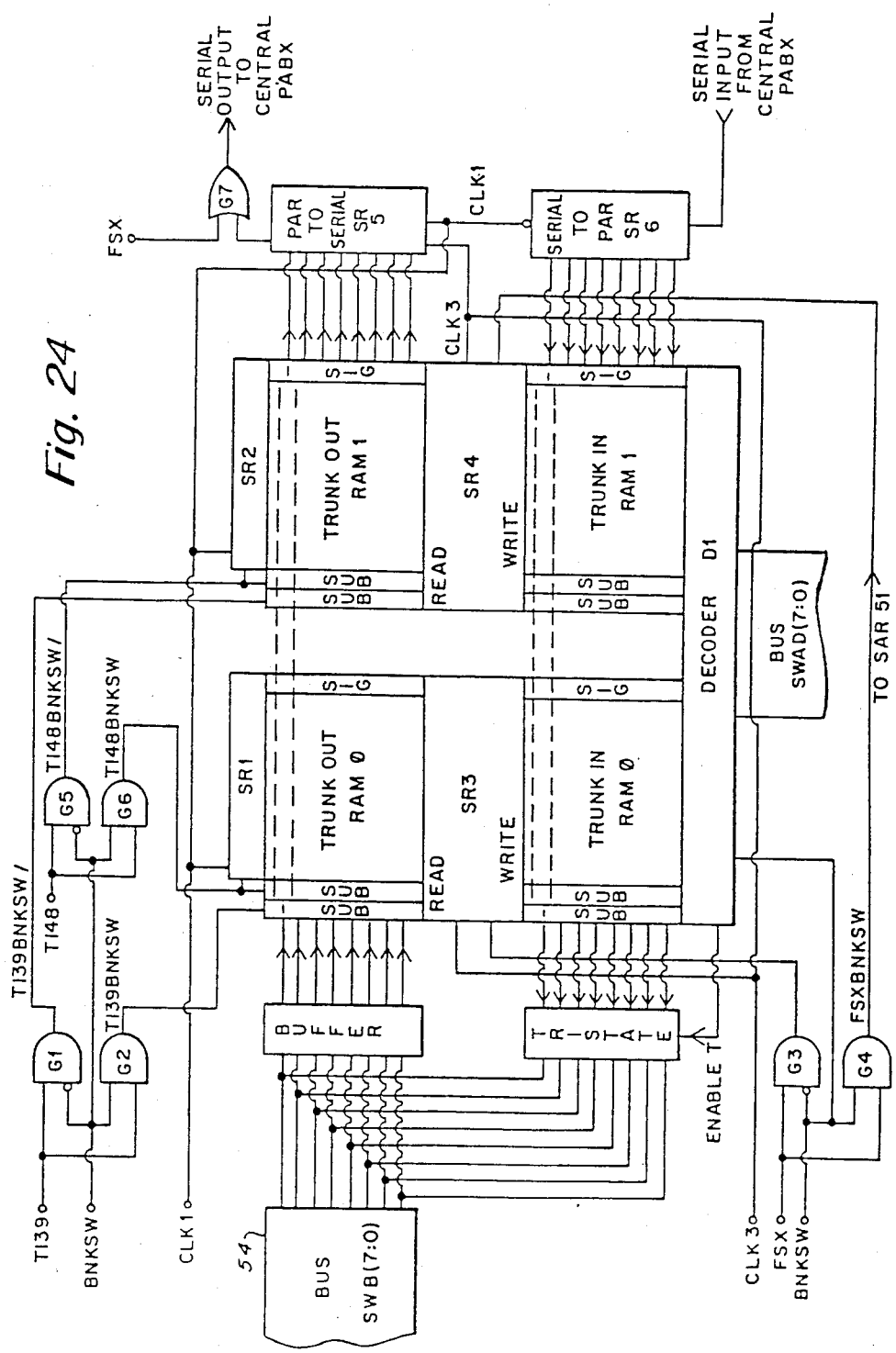
FIG. 24 is a block diagram of the trunk RAM circuitry.

Operation of the trunk circuit is shown in FIG. 24. When the BNKSW signal is high, the Trunk-Out-RAM ∅ and Trunk-In-RAM ∅ communicate with the SW bus 54 while Trunk-Out-RAM 1 and Trunk-In-RAM 1 are in the I/O mode. Trunk-Out-RAM∅ is addressed by 22-bit shift register SR1 (activated by pulse R148 from AND gate 6) and Trunk-In-RAM ∅ by the decoder D1. While Trunk-Out-RAM 1 and Trunk-In-RAM 1 are in the I/O mode, they are addressed by shift register SR4. Trunk-Out-RAM 1 loads the PAR to serial register SR5 with 8-bit words, which are then shifted out serially through OR gate G7 to a central PABX.

At the same time, the serial to PAR register SR6 receives a serial bit stream from the central PABX and writes one byte into Trunk-In-RAM 1 during the 8th bit period. Note that the RAMs must have separate Data-in and Data-out lines. When BNKSW=0, the right side and left side RAMs change roles.

XIII. TIMING

Figure 3B:
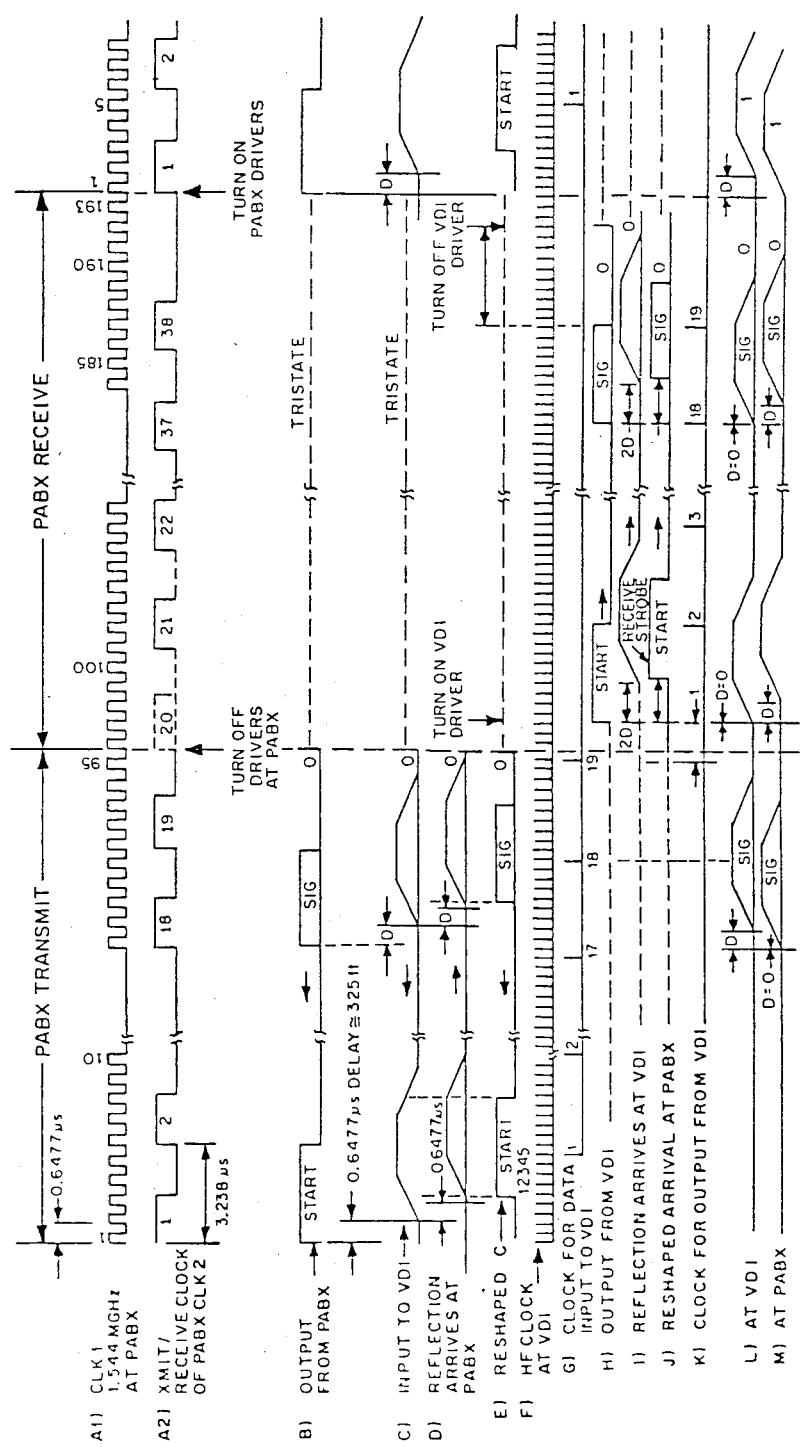

Timing between the telephone subscriber's station and the PABX is shown in FIG. 3B. Line A1 of FIG. 3B shows the previously mentioned 1.544-MHz clock pulses (CLK1), which is recovered from the standard T1 trunk clock pulses. This clock contains exactly 193 pulses in a 125 μs frame. Clock CLK1 is divided by 5 to generate the CLK2 I/O clock pulses (see waveform A2 FIG. 3B). This results in 38 CLK2 pulses. Line B FIG. 3B shows the bit stream at the output of the PABX line driver transmitters.

Line C FIG. 3B indicates the waveform received by the VDI telephone chip. It consists of a start bit (always "one"), 8 voice bits, 8 data bits, a signalling bit, and a stop bit (always zero). The purpose of the stop bit is to discharge the telephone line to zero so that the next start bit can be detected. Line C is a delayed and lower-transition-time version of line B. In the diagram, the delay is 0.6477 μs, which corresponds to 325 feet for a propagation velocity of ½c (c=velocity of light). Line D shows the reflection arriving at the PABX with an additional delay of 0.6477 μs. The PABX driver can be turned off as soon as the reflection has returned and the termination is no longer needed.

Line E shows the reshaped version of line C. The assumption here is that, even though the transition times will delay the midpoint crossing, the delay will be constant for rise and fall. Actually, this is only true if the transition is a ramp. Other transitions will cause fixed translation in time, which can be taken into account with the timing logic.

Line F shows the high-frequency clock pulses used to sample the input at the VDI 160 (FIG. 5) to detect the arrival of a start pulse. The sample clock may preferably be a 2×1.544 MHz clock which provides 10 samples for each start bit.

After the sample clock detects 10 consecutive "ones," the VDI logic regards this input as a start pulse. After an additional 5 sample pulses, the first pulse (line G) for strobing in the bit stream from the PABX is generated.

After 19 strobe pulses, the VDI switches to the transmit mode. The first clock pulse (line K) for transmitting from the VDI occurs 4 sample pulses after the 19th strobe. Note that the time separation between turning off the PABX driver and turning on the VDI driver is to assure that the two drivers are never on at the same time. The worst case occurs for zero delay when the VDI drivers are turned on 2 samples earlier.

Line J, the bit stream sent by the VDI to the PABX, arrives in time to be clocked in reliably by CLK2 of the PABX. Lines L and M show the waveforms on the line at the PABX and VDI chips. Note that in each case the signalling bit is followed by a zero so that the start bit can be recognized as a "zero" to "one" transition.

XIV. OPERATION OF LOCAL SIGNALLING

Figure 25:
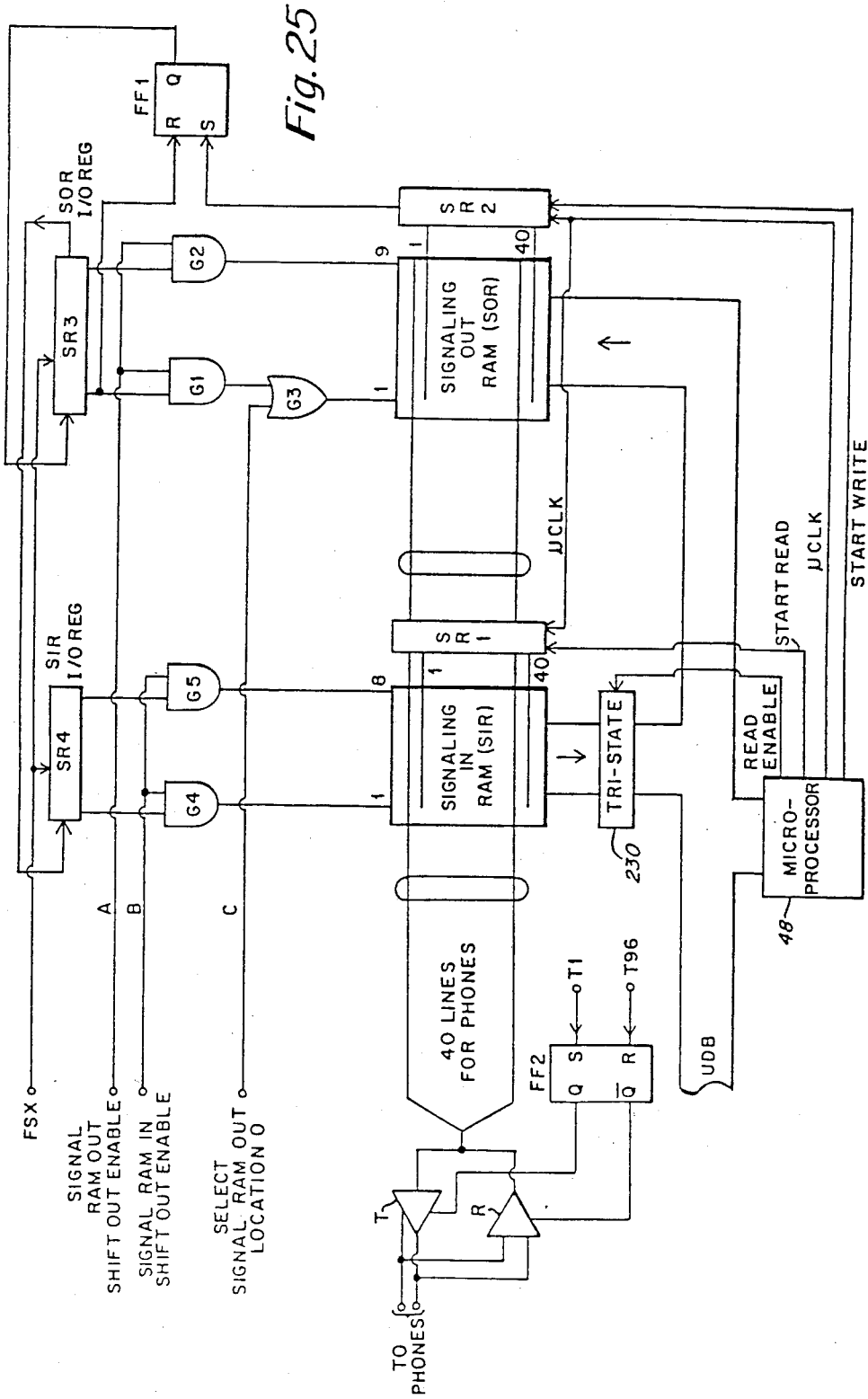
FIG. 25 is a block diagram of the circuitry used for local signalling within the PABX of the invention.

Local signalling may be described with the aid of FIGS. 25 and 3A. The cycle starts with the microprocessor reading the Signalling-In-RAM (SIR). The microprocessor activates a SIR tristate logic circuit 230 with a μP read enable signal and supplies a start read pulse to shift register SR1 to initiate a token and supplies a read clock pulse (μ CLK) to SR2 and SR1. This action is permitted to occur at any time slot during the frame.

The microprocessor 48 can start writing to the SOR immediately after reading by sending a start write signal to SR2 to initiate the token and a μP clock signal to activate the shift register SR2. After the token has left the SOR shift register SR2, it sets Flip Flop FF1. FF1 supplies a token to the SOR I/O register SR3, which initiates transmission of signalling from Signalling-Out-RAM (SOR). Transmission starts a frame immediately after FF1 is set.

At the start of a frame, the transmitter (driver T) is turned on with timing pulse T1 which sets Flip Flop FF2. During the transmission time of the first bit element, *none* of the memory locations are selected. When no memory locations are selected, the output is high (by design protocol), causing the start bit to be a "one."

During bit element 18, line A activates transmission from the SOR. During occurrence of a frame, the first stage of the SOR I/O register SR3 is high. This, combined with a "high" on line A, outputs the first bit of the SOR, which is always "zero." Note that prior to occurrence of a frame, the SOR is not selected. Consequently, the output of the SOR is a series of "ones." The appearance of a "zero" during bit element 18 signifies to the VDI chip at the telephones that a signalling message follows. Note also that the output of the SOR I/O reg stage 1 resets FF1 This is to prevent more than one token from entering the SR2 register.

During bit element 19, line C reads the first SOR location, which causes the transmission of a stop bit (a logical zero). During bit element 38, line B becomes high, but the SIR is not selected because there is no token in the SIR I/O register. This is the end of a frame.

During the next frame, the same sequence of events is repeated except that the token in SOR I/O register advances to the right. This is repeated for 9 signalling bits. The token is passed to SIR I/O register (stage 1 output) during frame 9. Thus, when line B goes high during F10, the first SIR location is written into. Note that the VDI chip is notified during frame 1 that signalling will have to be sent to the PABX starting at frame 10, giving it 9 frames to prepare. Signalling transmission from the VDI is completed by frame 17. The microprocessor 48 can thus wait 17 frames to read the information or it can come back for it 50 ms later during its scheduled read/write cycle.

XV. SAR UPDATE

Figure 26:
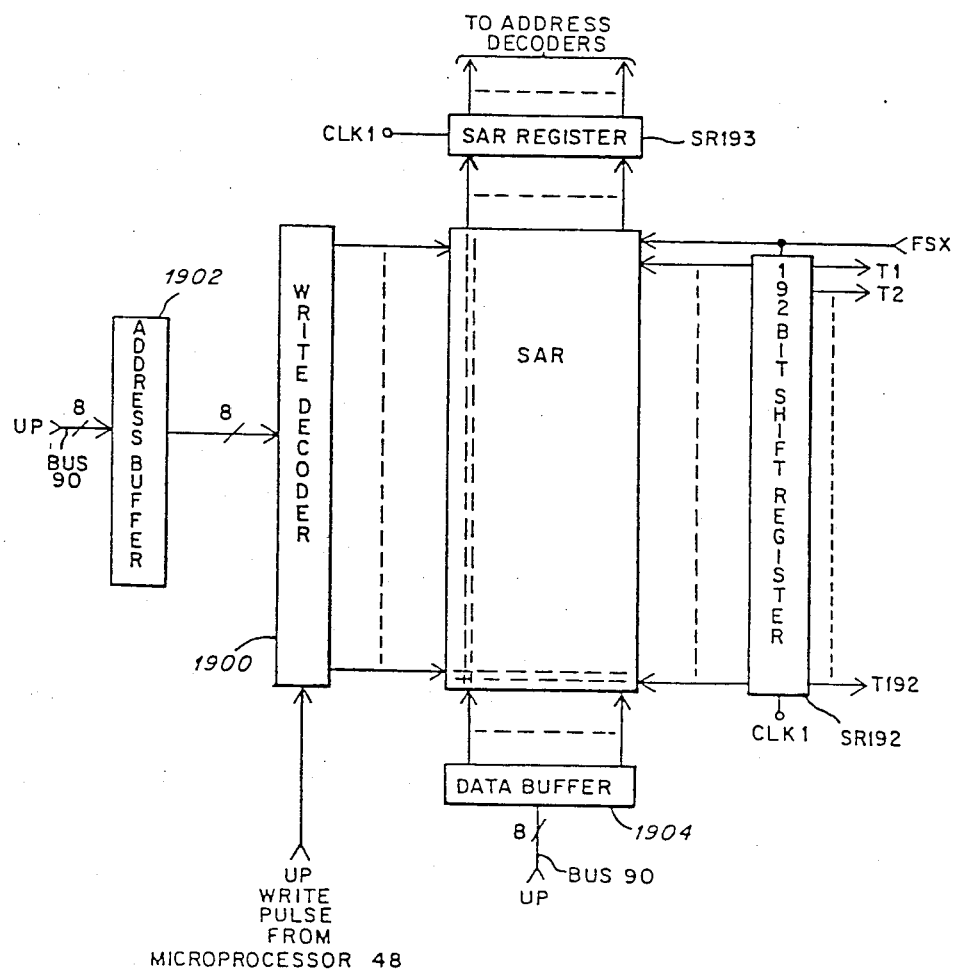
FIG. 26 is a diagramatic representation illustrating the source address register updating.

Reading from, and writing to, the Source-Address-RAM (SAR) can be described with the aid of FIG. 26.

Reading of the SAR is accomplished with a 192-bit shift register SR192 switched by clock pulses T1 to T192. Writing is achieved with a write decoder 1900 that is normally inhibited from making *any* selections. The decoder 1900 only selects a word when it gets a write pulse from the microprocessor 48. Since there are separate read, write, data in and data out lines to the SAR, the microprocessor 48 can write any time it provides a write pulse. Address and data buffers 1902 and 1904 are provided to prevent loading of the microprocessor bus 90. The microprocessor 48 can write at any time but its write pulse will have a fixed time relation to a given time slot.

After the contents of the SAR are transferred into the SAR register SR193, the register's output is applied to the various address decoders to select the source information. The use of an SAR register SR192 has two purposes:
1. It makes timing less critical by allowing a time slot of 648 ns for reading the SAR and setting up the input to the SAR register.
2. It allows the address to be applied to the address decoders for a full 648 ns, required by the delays of the bus, decoder, and memory reading.

FSX signalling with the 192-bit shift register SR192 also provides all the time slot pulses (T1 to T192) for controlling all operations on the chip. The time-slot allocations are indicated in FIG. 27 for the various internal operations performed.

XVI. DATA SUBCHANNELS

The link between each data terminal and the PABX chip is 64 Kb/s regardless of terminal speed. However, when transmitting/receiving via the trunk, lower speed terminals occupy ⅛ of a trunk full channel. The 1.544 MHz trunk consists of 24 channels with the following channel assignments. Channels 1 and 2 are subdivided into 16 8 Kb/s subchannels for terminals below 8 Kb/s; channels 3–23 are shared between voice and high speed data terminals (8–64 Kb/s); channel 24 is used for signalling.

For high speed data terminals data messages are assembled in the telephones voice/data integration (VDI) chip and transmitted to the PABX chip at a rate of one byte per frame. Similar messages are formed for lower speed terminals and transmitted at one bit per frame with the remaining 7 bits having the same logical value as the transmitted bit. Difficulties caused by non-integral relationship between data terminal bit rates and line bit rates are accommodated by a communication protocol. When no messages are transmitted, all 8 bits will be "ones" for low and high speed terminals. As noted previously, the start of a message is recognized by a transition from all "ones" to all "zeros" in the receiving VDI chip.

Messages are switched in the PABX chip without being recognized as such. The message format contains a start byte (all "zeros"), a designation of the number of transmitted bytes and data information.

Equivalents

While what has been described constitutes the presently most preferred embodiment of the invention, it can be varied in many ways, as is apparent from the above discussion, and the invention should, therefore, only be limited insofar as is required by the scope of the following claims.

We claim:

1. A system for exchanging messages between subscribers and an exchange wherein messages of serial trains of digital pulses are coupled from an exchange to each subscriber during a TRANSMIT half of a transmission frame and messages of serial bits of pulses from each of the subscribers are coupled to the exchange during the RECEIVE half of a transmission frame, said system comprising:
    (a) a message input array of addressable memory elements into which a first group of said pulses are written as M words of N bits;
    (b) a message output array of addressable memory elements into which the first group of pulses are transferred and stored as N words of M bits and are read out as M words of N bits for transmission to said subscribers;
    (c) signalling input and output arrays of addressable memory elements wherein at least one of said digital pulses is written into the signalling input array; and
    (d) a data processor for periodically reading the information in the signalling input array and transferring outgoing signalling information to said signalling output array for transmission to said subscribers.

2. The system of claim 1 in which writing into and reading out of the message output array and writing into the message input array is performed in a fixed sequence while the reading out sequence of the message input array is varied in accordance with the desired interconnection of subscribers.

3. The system of claim 2 including a source address array of addressable memory elements into which the processor, in response to the signalling pulses written into the signalling input array, writes information indicating connections to be made between subscribers, said source address array controlling the sequence in which the message information is transferred from the message input array to the message output array.

4. The system of claim 1 wherein all subscribers transmit messages to the exchange, concurrently, in response to a signal sent from the exchange.

5. The system of claim 4 wherein the signal comprises the first pulse from the signalling output array.

6. The system of claim 5 in which the word format of the signalling output array comprises a word, the first bit of which is always a zero.

7. The system of claim 1 in which receivers and transmitters are provided at the exchange, one each for each subscriber, and the transmitters and receivers are coupled by a single wire pair to the message input and output array.

8. The system of claim 1 in which a duplicate set of message input and output arrays is provided and wherein information is written into a first input array during a first time period, and information in the first input array is transferred to a first output array during a second time period while a second input array is written into during said second time period, and information is read out of said first output array during a third time period while information in the second input array is transferred to a second output array during said third time period, and information in said second output array is read out during a fourth time period.

9. The system of claim 8 wherein the information to be transmitted from the subscribers is written in during one half of a first transmission frame and the information to be transmitted to the subscribers is read out during another half of a second transmission frame.

10. The apparatus of claim 1 wherein the message input array is coupled to a trunk having a plurality of channels, some of which are subdivided for low speed communication leaving the un-subdivided channels for high speed communication.

11. The apparatus of claim 10 wherein the signalling from the trunk is achieved on an interrupt basis by said data processor.

12. A switching system for exchanging messages between N telephone/data subscribers through a private automatic branch exchange (PABX) wherein the PABX and the telephone/data terminals of each subscriber are coupled by a relatively short transmission line and wherein messages of M bits of information are coupled from the PABX to each N subscriber during a TRANSMIT half of a transmission frame and voice and/or data messages of M bits of information from each of the N subscribers are coupled to the PABX during the RECEIVE half of a transmission frame and wherein one of the M bits is a start bit indicating the start of transmission and one is a stop bit indicating the end of transmission and one is a signalling bit containing signalling information to the PABX and the remaining bits contain voice or data communication information, said system comprising:
  (a) a message input array of addressable memory elements into which the voice or data message bits are written in a fixed sequence as M−3 words of N bits;
  (b) a message output array of addressable memory elements into which the M−3 words of N bits are transferred and stored as N words of M−3 bits and are read out as M−3 words of N bits;
  (c) signalling input and output arrays of addressable memory elements wherein the signalling bits are written into the signalling input array in a fixed sequence;
  (d) a data processor for periodically reading the information in the signalling input array and transferring outgoing signalling information to said signalling output array for transmission to said telephone/data terminals;
  (e) a source address array of addressable memory elements into which the processor, in response to the signalling bits in the signalling input array, writes bit information indicating connections made between subscribers, said source address array controlling the sequence in which the message bit information is transferred from the message input array to the message output array.

13. The switching system of claim 12 in which writing into and reading out of the message output array and writing into the message input array is performed in a fixed sequence while the reading out sequence of the message input array is varied in accordance with the desired interconnection of subscribers.

14. The switching system of claim 12 wherein all subscribers transmit messages to the PABX, concurrently, in response to an RSI signal sent from the PABX.

15. The switching system of claim 14 wherein the RSI signal comprises the first bit of the signalling output array.

16. The switching system of claim 15 in which the word format of the signalling output array comprises an L bit word, the first bit of which is always a zero.

17. The switching system of claim 16 wherein L=9, and M=19 of which 8 bits are used for voice messages and 8 bits for data messages.

18. The switching system of claim 12 in which a duplicate set of message input and output arrays is provided and wherein information is written into a first input array during a first time period, and information in the first input array is transferred to a first output array during a second time period while a second input array is written into during said second time period, and information is read out of said first output array during a third time period while information in the second input array is transferred to a second output array during said third time period, and information in said second output array is read out during a fourth time period.

19. The switching system of claim 18 wherein the information to be transmitted from the subscribers is written in during one-half of a first transmission frame and the information to be transmitted to the subscribers is read out during another half of a second transmission frame.

20. The switching system of claim 12 in which N receivers and transmitters are provided at the PABX for separate reception of messages from each N subscriber and separate transmission of messages to each N subscriber and the input of each receiver and the output of each transmitter are coupled together to the message input and output arrays by N individual wire pairs.

21. The method of claim 12 wherein the digital pulses are written into the signalling input array and read out of the signalling output array at predetermined time intervals.

22. A method for exchanging messages between N subscribers and an exchange wherein messages of N words of serial trains of digital pulses of M bits in length are coupled from an exchange to each subscriber during a TRANSMIT half of a transmission frame and messages of N words of serial bits of pulses of M bits in length from each of the subscribers are coupled to the exchange during the RECEIVE half of a transmission frame, said method comprising the steps of:
  (a) writing into a message input array of addressable memory elements a first group of said pulses as M words of N bits;
  (b) transferring into a message output array of addressable memory elements, the first group of pulses as N words of M bits; and
  (c) reading out the transferred pulses as M words of N bits for transmission to said subscribers.

23. The method of claim 22 including the steps of
  (d) writing at least one of said digital pulses into a signalling input array; and
  (e) periodically reading out the information in the signalling input array and transferring outgoing signalling information to a signalling output array for transmission to said subscribers.

24. The method of claim 23 including the step of: in response to the signalling pulses written into the signalling input array, writing information indicating connections to be made between subscribers into a source address array for controlling the sequence in which the message information is transferred from the message input array to the message output array.

25. The method of claim 22 in which writing into and reading out of the message output array and writing into the message input array is performed in a fixed sequence while the reading out sequence of the message input array is varied in accordance with the desired interconnection of subscribers.

26. The method of claim 22 wherein all subscribers transmit messages to the exchange, concurrently, in response to a signal sent from the exchange.

27. The method of claim 26 wherein the signal comprises the first pulse from the signalling output array.

28. The method of claim 26 in which the word format of the signalling output array comprises a word, the first bit of which is always a zero.

29. The method of claim 22 in which receivers and transmitters are provided at the exchange, one each for each subscriber, and coupling the transmitters and receivers by a single wire pair to the message input and output array.

30. The method of claim 22 in which a duplicate set of message input and output arrays is provided and wherein information is written into a first input array during a first time period, and information in the first input array is transferred to a first output array during a second time period while a second input array is written into during said second time period, and information is read out of said first output array during a third time period while information in the second input array is transferred to a second output array during said third time period, and information in said second output array is read out during a fourth time period.

31. The method of claim 30 wherein the information to be transmitted from the subscribers is written in during one half of a first transmission frame and the information to be transmitted to the subscribers is read out during another half of a second transmission frame.

32. A method for exchanging messages between N telephone/data subscribers through a private automatic branch exchange (PABX) wherein the PABX and the telephone/data terminals of each subscriber are coupled by a relatively short transmission line and wherein messages of M bits of information are coupled from the PABX to each N subscriber during a TRANSMIT half of a transmission frame and voice and/or data messages of M bits of information from each of the N subscribers are coupled to the PABX during the RECEIVE half of a transmission frame and wherein one of the M bits is a start bit indicating the start of transmission and one is a stop bit indicating the end of transmission and one is a signalling bit containing signalling information to the PABX and the remaining bits contain voice or data communication information, said method comprising the steps of:

(a) writing data or voice message bits into a message input array of addressable memory elements in a fixed sequence as $M-3$ words of N bits;

(b) transferring into a message output array of addressable memory elements the $M-3$ words of N bits as N words of $M-3$ bits; and (c) reading out the transferred bits as $M-3$ words of N bits;

(d) signalling input arrays of addressable memory elements in a fixed sequence;

(e) periodically reading the information in the signalling input array and transferring outgoing signalling information to a signalling output array for transmission to said telephone/data terminals;

(f) in response to the signalling bits in the signalling input array, writing bit information indicating connections made between subscribers, in a sequence controlled by said source address array.

33. The method of claim 32 in which writing into and reading out of the message output array and writing into the message input array is performed in a fixed sequence while the reading out sequence of the message input array is varied in accordance with the desired interconnection of subscribers.

34. The method of claim 32 wherein all subscribers transmit messages to the PABX, concurrently, in response to an RSI signal sent from the PABX.

35. The method of claim 34 wherein the RSI signal comprises the first bit of the signalling output array.

36. The method of claim 35 in which the word format of the signalling output array comprises an L bit word, the first bit of which is always a zero.

37. The method of claim 36 wherein $L=9$, and $M=19$ of which 8 bits are used for voice messages and 8 bits for data messages.

38. The method of claim 32 in which a duplicate set of message input and output arrays is provided and wherein information is written into a first input array during a first time period, and information in the first input array is transferred to a first output array during a second time period while a second input array is written into during said second time period, and information is read out of said first output array during a third time period while information in the second input array is transferred to a second output array during said third time period, and information in said second output array is read out during a fourth time period.

39. The method of claim 38 wherein the information to be transmitted from the subscribers is written in during one-half of a first transmission frame and the information to be transmitted to the subscribers is read out during another half of a second transmission frame.

40. The method of claim 32 in which N receivers and transmitters are provided at the PABX for separate reception of messages from each N subscriber and separate transmission of messages to each N subscriber and the input of each receiver and the output of each transmitter are coupled together to the message input and output arrays by N individual wire pairs.

* * * * *